United States Patent [19]
Nyui et al.

[11] Patent Number: 6,093,081
[45] Date of Patent: Jul. 25, 2000

[54] POLISHING METHOD AND POLISHING APPARATUS USING THE SAME

[75] Inventors: Masaru Nyui, Utsunomiya; Mikichi Ban, Miura; Kazuo Takahashi, Kawasaki, all of Japan

[73] Assignee: Canon Kabushiki Kaisha, Tokyo, Japan

[21] Appl. No.: 08/848,159

[22] Filed: Apr. 29, 1997

[30] Foreign Application Priority Data

| May 9, 1996 | [JP] | Japan | 8-139611 |
| May 9, 1996 | [JP] | Japan | 8-139612 |
| May 9, 1996 | [JP] | Japan | 8-139613 |

[51] Int. Cl.⁷ .............. B24B 49/12; B24B 49/04
[52] U.S. Cl. .................. 451/6; 451/41
[58] Field of Search ............. 451/41, 6, 287, 451/288; 438/692, 693

[56] References Cited

U.S. PATENT DOCUMENTS

| Re. 34,425 | 11/1993 | Schultz | 51/165.74 |
| 4,221,486 | 9/1980 | Jaerisch et al. | 356/357 |
| 4,617,469 | 10/1986 | Takahashi et al. | 250/548 |
| 4,659,225 | 4/1987 | Takahashi | 356/358 |
| 4,787,749 | 11/1988 | Ban et al. | 356/381 |
| 4,874,954 | 10/1989 | Takahashi et al. | 250/548 |
| 5,196,353 | 3/1993 | Sandhu et al. | 437/8 |
| 5,270,222 | 12/1993 | Moslehi | 437/8 |
| 5,382,551 | 1/1995 | Thakur et al. | 437/247 |
| 5,399,233 | 3/1995 | Murazumi et al. | 156/635 |
| 5,461,007 | 10/1995 | Kobayashi | 437/225 |
| 5,486,129 | 1/1996 | Sandhu et al. | 451/5 |
| 5,492,594 | 2/1996 | Burke et al. | 216/86 |
| 5,609,511 | 3/1997 | Moriyama | 451/5 |
| 5,663,797 | 9/1997 | Sandhu | 451/6 |
| 5,705,435 | 1/1998 | Chen | 438/8 |

FOREIGN PATENT DOCUMENTS

| 0 562 718 A1 | 9/1993 | European Pat. Off. . |
| 5-234971 | 9/1993 | Japan . |
| 6-252113 | 9/1994 | Japan . |

OTHER PUBLICATIONS

Patent Abstracts of Japan, vol. 014, No. 528, Nov. 1990 for No. 2–222533 filed Sep. 1990.

*Primary Examiner*—Robert A. Rose
*Attorney, Agent, or Firm*—Fitzpatrick, Cella, Harper & Scinto

[57] ABSTRACT

A polishing method of polishing the surface of a layer provided on the surface of a substrate includes a surface configuration measuring step of detecting surface information at a plurality of locations on the layer and obtaining the surface configuration of the layer, the surface configuration of the layer being obtained by measuring a distance from a reference surface set relative to the surface of the layer, a film thickness distribution measuring step of detecting the film thicknesses at a plurality of locations on the layer and obtaining the film thickness distribution of the layer, a determining step of determining whether the surface configuration and film thickness distribution of the layer are within a preset allowable range and a polishing controlling step of continuing or stopping the polishing on the basis of a result of the determination in the determining step.

18 Claims, 14 Drawing Sheets

FIG. 16
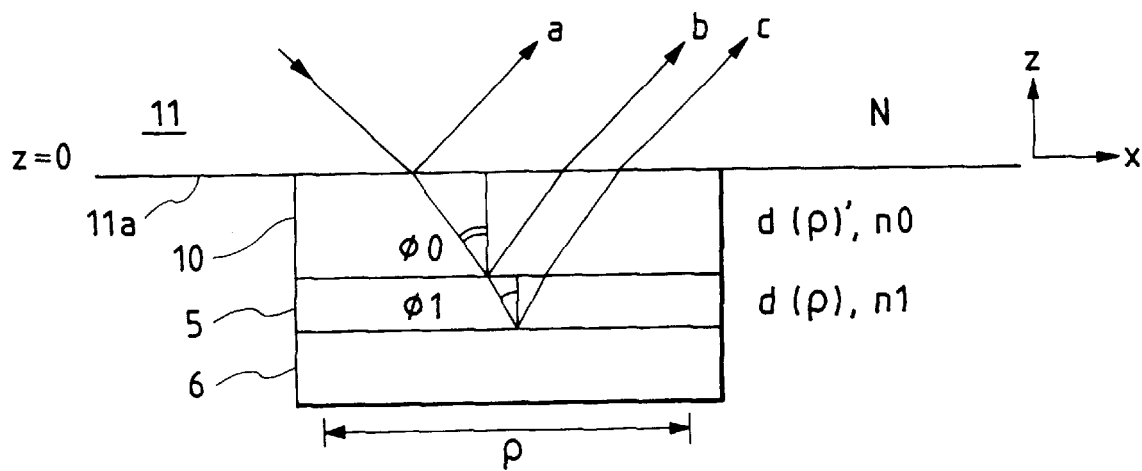
FIG. 17A
FIG. 17B
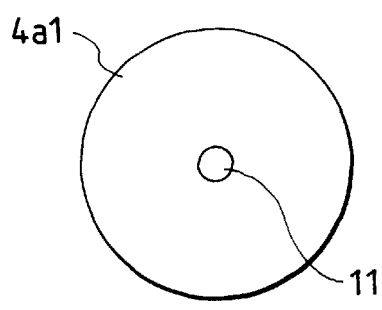
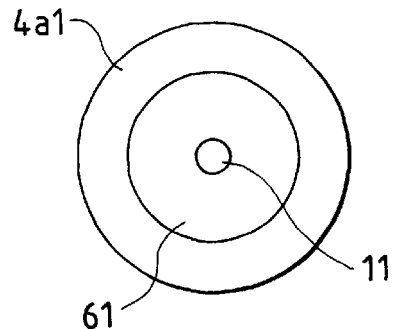

POLISHING METHOD AND POLISHING APPARATUS USING THE SAME

BACKGROUND OF THE INVENTION

1. Field of the Invention

This invention relates to a polishing method for chemically and mechanically polishing and flattening the surface of a substrate such as a wafer on which dielectric layers or the like are laminated in a semiconductor device manufacturing process or the like and a polishing apparatus using the same, and is suitable, for example, in a lithography process for accurately detecting the termination point of the polishing step for an insulating layer (film layer) applied onto a silicon substrate, making the film thickness of the insulating layer fall within a predetermined range and efficiently performing the process of flattening the surface configuration of the insulating layer to thereby obtain a semiconductor device of a high degree of integration.

2. Related Background Art

In recent years, along with the higher integration of semiconductor devices, making the device structure three-dimensional has advanced together with making circuit patterns minute. If the numerical aperture of a projection optical system is increased to achieve the higher integration of semiconductor devices, the depth of focus of the projection optical system will become correspondingly shallow and it will become necessary to minimize the unevenness of the surface of a substrate such as a wafer on which wiring or a dielectric is laminated, and to secure the depth of focus. Further, along with the progress of the tendency toward multiple layers, the unevenness of the surface makes the formation of wiring patterns difficult and locally results in a reduction in reliability due to the thinning of the patterns. Therefore, it is important to polish the surface of the substrate such as a wafer on which wiring or dielectric layers are laminated, remove level difference portions or uneven portions to flatten the surface, and apply a photoresist onto the flattened surface and projection-expose it to thereby achieve a high resolving power.

Also, it is an important requirement for making the irregularity of the inter-layer volume and the depth of a through hole constant to polish the insulating layer provided on a silicon substrate to thereby provide a layer of a uniform thickness.

A chemical and mechanical polishing method has heretofore been proposed as the flattening technique of removing the uneven portions or the level difference portions of the surface of a substrate such as a wafer on which wiring or dielectric layers are laminated and flattening the surface.

In the chemical and mechanical polishing, it is necessary to appropriately control the polishing rate, the slurry density in the polishing liquid, the temperature of the polished surface, etc., in order to make the polishing efficient. If there is a defect in this control, the insulating film provided on the silicon substrate will not assume a predetermined film thickness and the surface cannot be flattened, but it will become impossible to secure the depth of focus as previously mentioned or a reduction in the reliability of wiring will be caused, and a dishing phenomenon or a thinning phenomenon due to the polishing speed difference between the insulating film and the electrode wiring portion will occur, and short-circuiting between through holes will also be caused.

Therefore, when the surface of a substrate such as a wafer on which a dielectric or the like is laminated is to be polished and flattened, it becomes important to appropriately judge the termination point of polishing and flatten the surface without removing the material of the lower layer.

For example, a termination point detecting method of monitoring the film thickness and the surface configuration distribution of the surface layer of a substrate such as a wafer to be polished on which a dielectric or the like is laminated at one time on the spot and determining the level of the flattening of the whole surface or the localized flattening, and judging the optimum position for the termination of polishing becomes important in chemical and mechanical polishing. As polishing termination point detecting methods, there are, for example, a method of obtaining the amount of polishing from the polishing time, a method of obtaining a variation in polishing resistance from a variation in the electric current of a motor for driving a polishing stool, etc.

As the method of detecting the termination point of polishing in the flattening of the surface of a substrate such as a wafer on which a dielectric or the like is laminated by chemical and mechanical polishing, the method of obtaining the amount of polishing from the polishing time makes it necessary to constantly control conditions such as the pressure force to the surface to be polished, the degree of abrasion of a polishing pad, the slurry density in the polishing liquid, the temperature of the surface to be polished, etc., and therefore, it is difficult to detect the termination point accurately.

Also, the method of detecting a variation in polishing resistance from a variation in the electric current of the motor for driving a polishing stool makes it necessary to separate a signal waveform and noise from each other highly accurately and therefore, it is difficult to detect the termination point accurately and the local polishing situation of the surface to be polished cannot be detected.

On the other hand, in the step of polishing the surface of a substrate such as a wafer on which a dielectric is laminated, it becomes necessary in order to prevent the irregularity of the inter-layer volume and make the depth of a through hole constant to flatten the surface so that the surface may enter the depth of focus of the projection optical system and to make the thickness of the insulating layer on the surface fall within a predetermined range.

SUMMARY OF THE INVENTION

The present invention has as its object to provide a polishing method suitable for detecting, when flattening the surface of a substrate such as a wafer on which a dielectric or the like is laminated by chemical and mechanical polishing, the surface configuration and film thickness distribution of an insulating layer provided on the surface, and using these values to precisely judge the termination point of the polishing step to thereby efficiently flatten the surface in the semiconductor process and manufacture a semiconductor device of a high degree of integration, and a polishing apparatus using the same.

To achieve the above object, one form of the polishing method of the present invention is a polishing method of polishing the surface of a layer provided on the surface of a substrate, characterized by:

the surface configuration measuring step of detecting surface information at a plurality of locations on the layer and obtaining the surface configuration of the layer;

the film thickness distribution measuring step of detecting the film thicknesses at a plurality of locations on the layer and obtaining the film thickness distribution of the layer;

the determining step of determining whether the surface configuration and film thickness distribution of the layer are within a preset allowable range; and the polishing controlling step of continuing or stopping the polishing on the basis of the result of the determination at the determining step.

The polishing controlling step has the step of stopping the polishing when it is determined by the determining step that both of the surface configuration and film thickness distribution of the layer are within an allowable range.

The polishing controlling step has the step of stopping the polishing when it is determined by the determining step that the surface configuration of the layer is outside an allowable range and the minimum film thickness of the layer is equal to or less than a reference value.

The measurement by the surface configuration measuring step and the measurement by the film thickness distribution measuring step are simultaneously effected.

The same portion of the layer is measured at the surface configuration measuring step and the film thickness distribution measuring step.

One form of the polishing apparatus of the present invention is a polishing apparatus for driving the surface of a layer provided on the surface of a substrate and polishing means relative to each other to thereby polish the layer, characterized by:

detecting means for detecting the surface information of the layer; and changeover means for selectively changing over one of the polishing means and the detecting means relative to the polished surface of the layer and disposing it in an opposed relationship with the other of the polishing means and the detecting means.

The detecting means has means for detecting the surface information of the layer at a plurality of locations simultaneously.

The polishing means has a plurality of partial polishing tools for polishing a portion of the surface of the layer.

The detecting means has means for measuring the surface location information and film thicknesses at a plurality of locations on the layer.

The detecting means has distance measuring means for detecting the distance from the surface of the layer to a reference surface.

The detecting means has film thickness measuring means for measuring the film thickness of the layer.

The polishing apparatus has control means for determining from a signal from the detecting means by a determining portion whether the surface configuration and film thickness distribution of the layer are within a preset allowable range, and controlling whether to continue or stop the polishing of the layer on the basis of a signal from the determining portion.

Another form of the polishing method of the present invention is a polishing method of driving the surface of a layer provided on the surface of a substrate and polishing means relative to each other to polish the surface of the layer, characterized by the steps of:

setting a reference surface at a position sufficiently longer from the surface of the layer than the film thickness of the layer;

applying first and second light beams differing in coherent distance from each other from light source means to the layer and the reference surface;

individually detecting the reflected light beam from each surface based on the first light beam and the reflected light beam from each surface based on the second light beam by detecting means; and obtaining the surface information of the layer from a signal from the detecting means, and controlling the continuation or stoppage of the polishing of the layer on the basis of the surface information.

The surface information of the layer is the surface configuration and film thickness distribution of the layer.

The step of controlling has the determining step of determining whether the surface configuration and film thickness distribution of the layer are within a preset allowable range.

The step of controlling has the step of obtaining the surface information of the layer from the difference between the intensity of the reflected light beam from each surface based on the first light beam and the intensity of the reflected light beam from each surface based on the second light beam.

Another form of the polishing apparatus of the present invention is a polishing apparatus for driving the surface of a layer provided on the surface of a substrate and polishing means relative to each other to thereby polish the layer, characterized by:

a reference surface located at a position sufficiently longer from the surface of the layer than the film thickness of the layer;

applying means for applying first and second light beams differing in coherent distance from each other to the layer and the reference surface;

detecting means for individually detecting the reflected light beam from each surface based on the first light beam and the reflected light beam from each surface based on the second light beam; and control means for obtaining the surface information of the layer from a signal from the detecting means and controlling the continuation or stoppage of the polishing of the layer on the basis of the surface information.

The surface information of the layer is the surface configuration and film thickness distribution of the layer.

The control means has a determining portion for determining whether the surface configuration and film thickness distribution of the layer are within a preset allowable range.

The applying means has a semiconductor laser of a variable coherent distance.

The control means finds the surface information of the layer from the difference between the intensity of the reflected light beam from each surface based on the first light beam and the intensity of the reflected light beam from each surface based on the second light beam.

Another form of the polishing method of the present invention is a polishing method of driving the surface of a layer provided on the surface of a substrate and polishing means having a polishing pad of an area smaller than that of the surface of the layer relative to each other to thereby polish the layer, characterized by:

the detecting step of detecting the surface information of the layer by detecting means provided on a portion of the polishing means; and the controlling step of controlling the continuation or stoppage of the polishing of the layer on the basis of a signal from the detecting means.

The polishing means is movable in a plane parallel to the surface of the layer, and the detecting step has the step of detecting the surface information of the layer by the utilization of position information from position detecting means for detecting the position information of the polishing means in the plane.

The detecting step has the step of detecting the distance from the surface of the layer to a reference surface and measuring the film thickness of the layer.

The detecting step has the step of detecting the surface configuration and film thickness distribution of the layer, and the controlling step has the step of determining whether the surface configuration and film thickness distribution of the layer obtained from the detecting step are within a preset allowable range.

Another form of the polishing apparatus of the present invention is a polishing apparatus for polishing the surface of a layer provided on the surface of a substrate having:

polishing means driven relative to the surface of the layer and having a polishing pad of an area smaller than that of the surface of the layer; and detecting means secured to the polishing means for detecting the surface information of the layer.

The polishing means is movable in a plane parallel to the surface of the layer, and has position detecting means for detecting the position information of the polishing means in the plane, and the detecting means utilizes the position information from the position detecting means to find the surface information of the layer.

The detecting means has distance measuring means for detecting the distance from the surface of the layer to a reference surface and measuring the film thickness of the layer.

The polishing apparatus has control means for controlling the continuation or stoppage of the polishing of the layer on the basis of a signal from the detecting means.

The detecting means has means for detecting the surface configuration and film thickness distribution of the layer, and the control means has a determining portion for determining whether the surface configuration and film thickness distribution of the layer obtained from the detecting means are within a preset allowable range.

Specific embodiments of the present invention will become apparent from some embodiments which will be described later.

BRIEF DESCRIPTION OF THE DRAWINGS

FIG. 16 is an enlarged illustration of a portion of FIG. 15.

FIGS. 17A and 17B are enlarged illustrations of a portion of FIG. 12.

DESCRIPTION OF THE PREFERRED EMBODIMENTS

Figure 1:
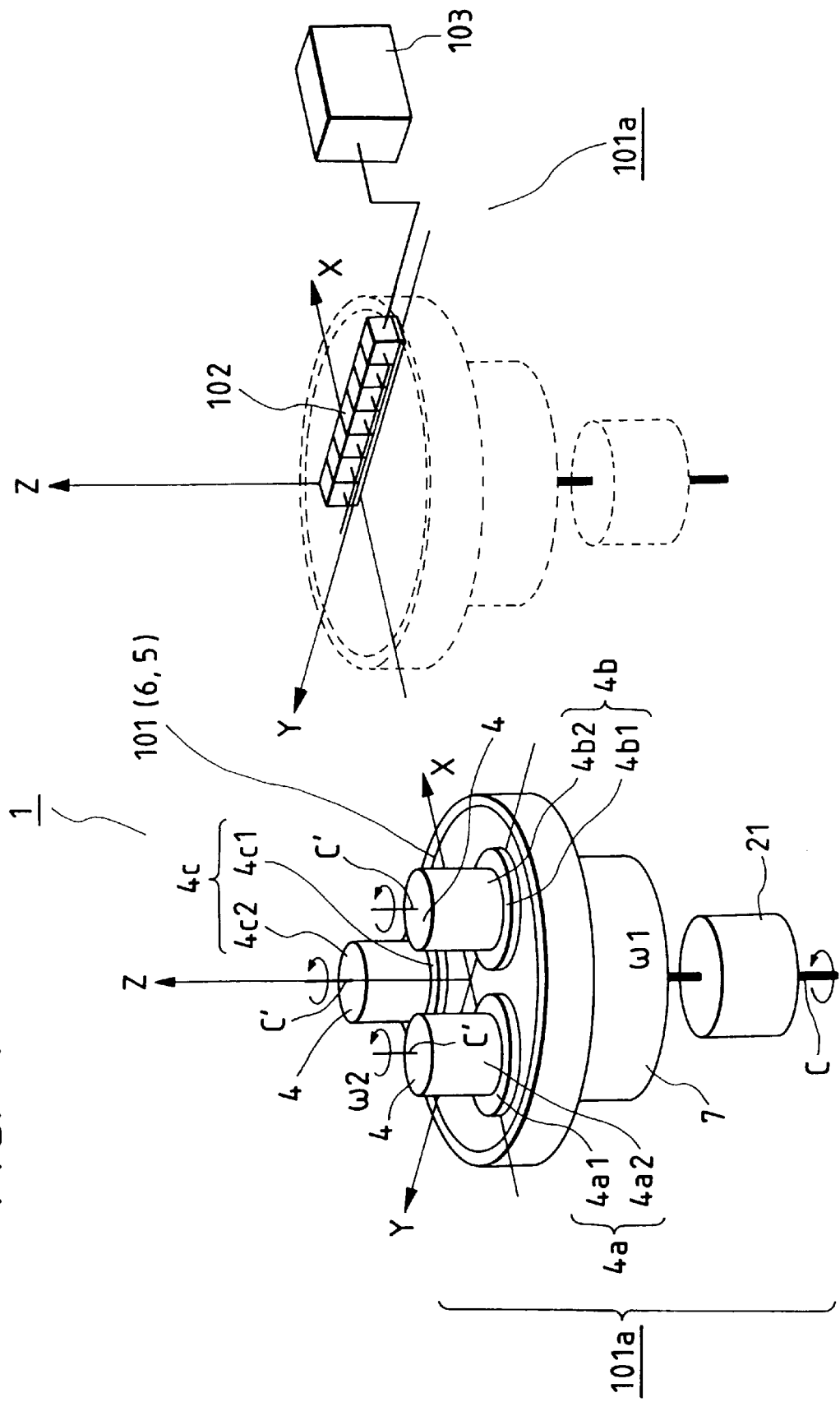
FIG. 1 is a schematic view of the essential portions of Embodiment 1 of the present invention.
Figure 2:
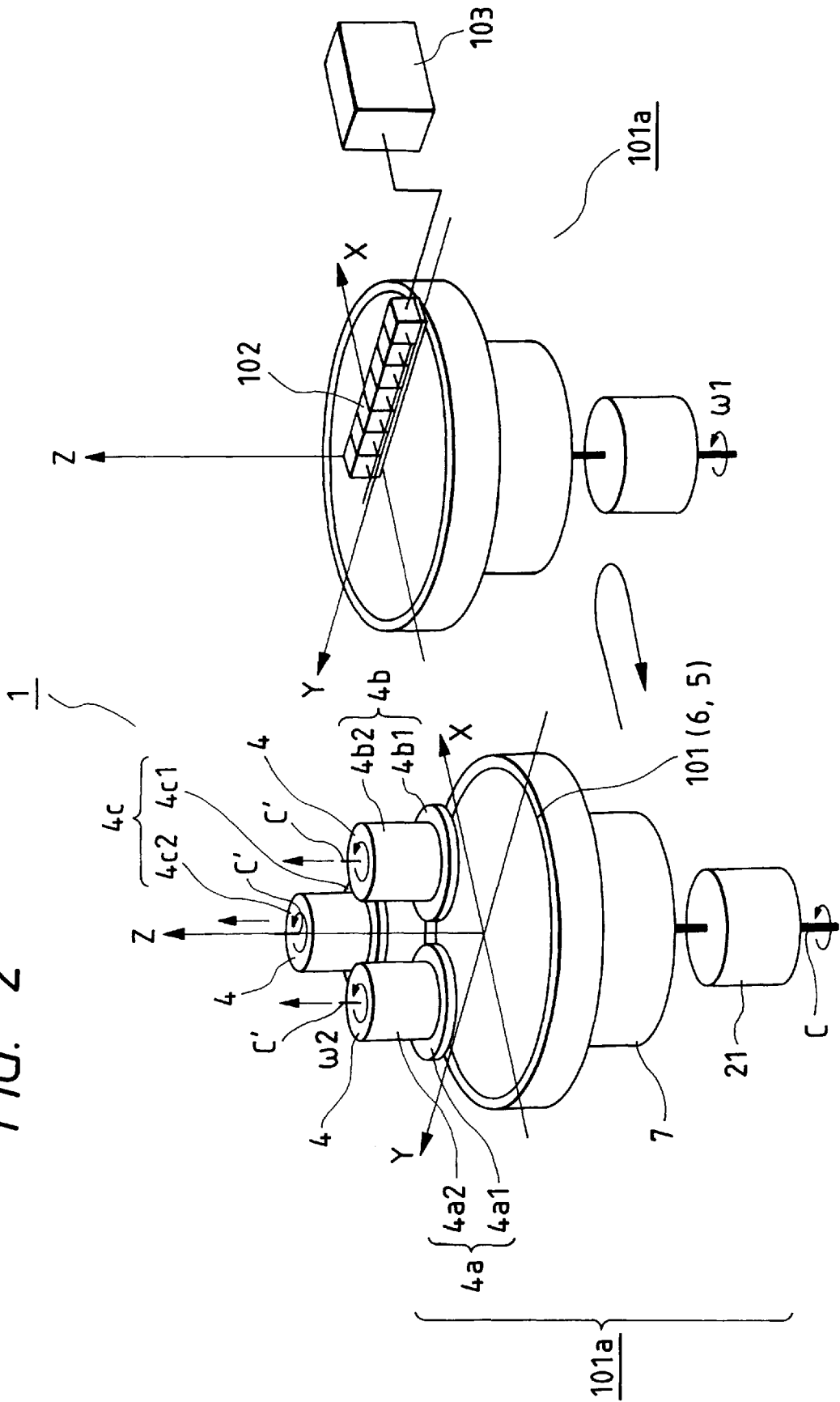
FIG. 2 is a schematic view of the essential portions of Embodiment 1 of the present invention.

FIGS. 1 and 2 are schematic views of the essential portions of Embodiment 1 of the present invention. In FIGS. 1 and 2, the reference numeral 1 designates a chemical and mechanical polishing apparatus. In FIG. 1, there is shown the manner in which the surface of a polished object 101 is polished, whereafter the supporting portion 101a of the polishing apparatus 1 is moved in the X direction and set at the position of a monitor unit array 102 indicated by a dotted line.

FIG. 2 shows a case where the surface information (surface configuration and film thickness distribution) of the workpiece 101 is detected by the fixed monitor unit array (detecting means) 102, and on the basis of the result of the detection by the monitor unit array 102, the termination point or the continuation or stoppage of the polishing step for the workpiece 101 is controlled by control means 103.

Members indicated by dotted lines in FIGS. 1 and 2 are imaginary members. The polished object 101 comprises a structure consisting of an insulating layer (film layer) 5 formed on a silicon substrate 6, and is held on a substrate holder 7.

In the present embodiment, the insulating layer 5 on the silicon substrate 6 is partially chemically-mechanically polished by a partial polishing tool 4 which will be described later. The substrate holder 7 holds the polished object 101 thereon and is rotated about a rotary shaft C at an angular speed $\omega 1$ by drive means (not shown). In FIGS. 1 and 2, the rotary shaft C is defined as the Z-axis, and a plane orthogonal thereto is defined as an X, Y plane.

The reference characters 4 (4a, 4b, 4c) denote partial polishing tools. The partial polishing tools 4a, 4b, 4c have polishing pads 4a1, 4b1, 4c1 and holders 4a2, 4b2, 4c2 holding the polishing pads 4a1, 4b1, 4c1, and are rotated about rotary shafts C' at an angular speed $\omega 2$ by drive means (not shown). FIGS. 1 and 2 show a case where the insulating layer 5 on the silicon substrate 6 is partially polished by the three polishing pads 4a1, 4b1, 4c1.

Figure 3A:
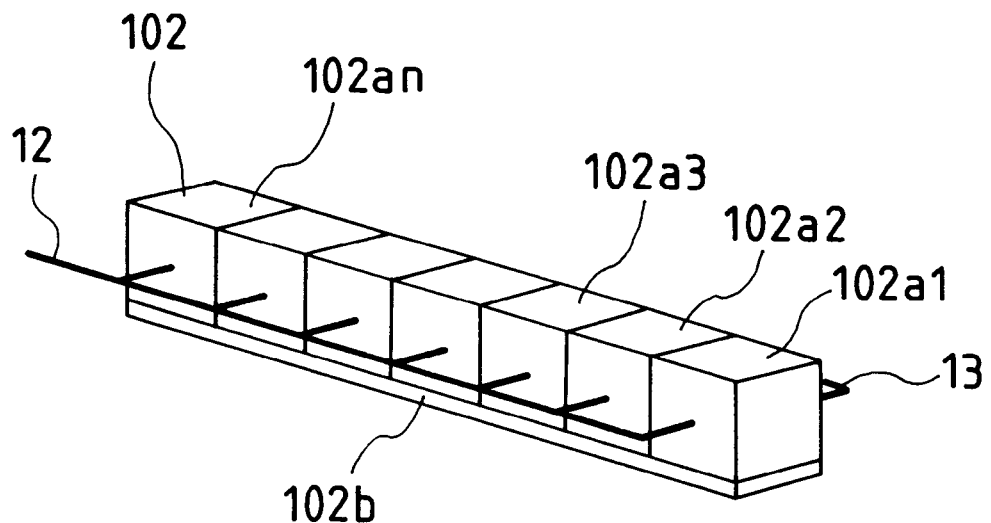
FIGS. 3A and 3B are schematic views of the monitor unit array of FIG. 1.
Figure 3B:
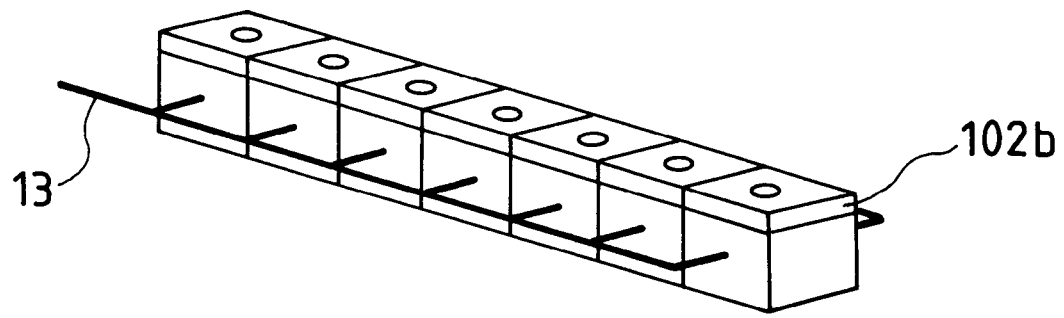

In the present embodiment, the polishing openings in the polishing pads 4a1, 4b1, 4c1 are smaller than the polished surface (insulating layer) 5 of the polished object 101. Thereby, the insulating layer is partially polished. The reference numeral 21 designates an encoder which detects the rotation information of the rotary shaft C. The monitor unit array 102, as shown in FIGS. 3A and 3B, comprises a plurality of sensors 102a1–102an one-dimensionally arranged in the Y-axis direction, and the surface conditions such as the surface configuration and film thickness distribution of the insulating layer 5 on the silicon substrate 6 are inspected by each sensor.

In the present embodiment, when the surface of the insulating layer 5 is to be polished, the partial polishing tool 4 is rotated about the rotary shafts C' and the substrate holder 7 is rotated about the rotary shaft C, and both of them are driven relative to each other and slurry including a polishing material is caused to flow out from a nozzle (not shown) onto the surface of the polished object 101 while the relative positions of the two in the X direction and Y direction are displaced as required, whereby the slurry is uniformly supplied to the interface between the insulating layer 5 and the polishing pads 4a1, 4b1, 4c1.

At this time, the ratio between the pressure and the number of revolutions of the insulating layer 5 and the partial polishing tool 4 and the quantity of slurry supplied are appropriately selected to thereby polish. Thus, the insulating layer 5 formed on the silicon substrate 6 is partially polished by the partial polishing tool 4 to thereby achieve the flattening of the surface thereof.

The surface of the insulating layer 5 is partially polished for a preset time, whereafter as shown in FIG. 2, the relative position of the partial polishing tool 4 and the polished object 101 in the Z direction is changed to separate the partial polishing tool 4 and the workpiece 101 from each other, and the supporting portion 101a including the substrate holder 7 is moved in the X direction and is disposed in an opposed relationship with the monitor unit array 102 installed in the Y-axis direction.

Then, the film thicknesses and surface configuration of the insulating layer 5 on the silicon substrate 6 at a plurality of locations are measured by the monitor unit array 102 while the polished object 101 is being rotated.

Thereby, the film thickness information over a wide area of the insulating layer 5 is detected efficiently. Also, with the rotation of the polished object 101, the polished object 101 is shifted in the Y direction. The design is made such that the amount of shift at this time is such that the non-measured area between the sensors can be newly measured. Thus, the non-measured area by the sensors becomes small.

The surface conditions such as the surface configuration and film thickness distribution of the entire insulating layer 5 are found by the control means 103 on the basis of the output signal from the monitor unit array 102. At this time, the control means 103 judges by a determining portion whether both of the surface configuration such as the unevenness or level difference on the surface of the insulating layer 5 and the film thickness distribution are within a preset range. When both are within the reset range, it is judged that polishing is at its termination point, and the polishing step is stopped. When not so, control is effected so that the supporting portion 101a is returned to its original position and the polishing step is again continued.

The control means 103 is designed to stop the polishing step when, during the polishing step, it is judged that both of the surface configuration and film thickness distribution of the insulating layer 5 are not within the preset range (when, for example, the insulating layer has been too much polished and has become too thin). At such a time, the polished object 101 is judged to be a defective article.

As described above, in the present embodiment, the design is made such that the insulating layer 5 of the silicon substrate 6 is flattened, whereby when projection exposure is effected, the entire area of the insulating layer 5 which becomes the object of projection exposure lies within the depth of focus of a projection optical system. Also, the film thickness of the insulating layer 5 may lie within a predetermined range to thereby prevent the irregularity of the inter-layer volume and unify the depth of a through hole.

FIGS. 3A and 3B are perspective views of the essential portions of the monitor unit array 102 in the present embodiment, and FIG. 3B shows a state in which FIG. 3A is seen from the bottom surface side. The monitor unit array 102 comprises a plurality of sensors 102a1, 102a2, ..., 102an arranged in a one-dimensional direction.

Figure 4:
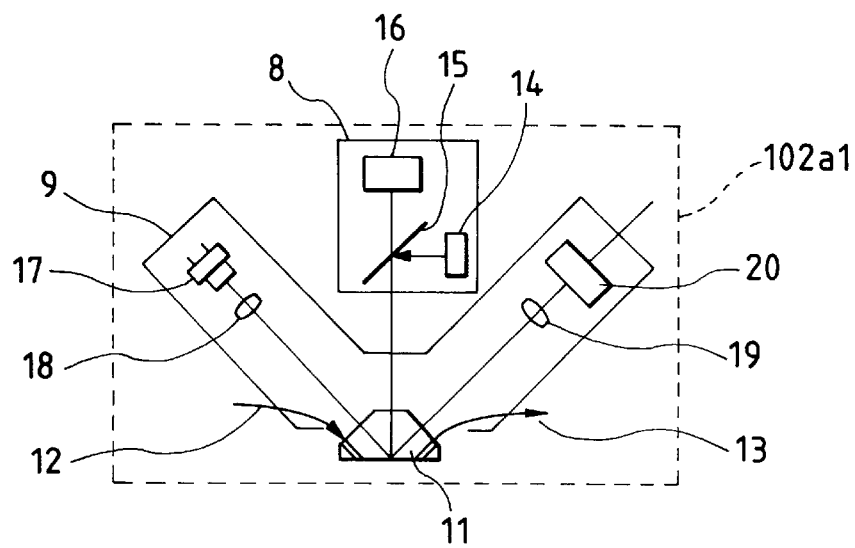
FIG. 4 is a schematic view of the essential portions of a sensor according to the present invention.

One of the sensor units, as shown in FIG. 4, has film thickness measuring means 8 for measuring the film thickness of the insulating layer 5 on the silicon substrate 6, and distance measuring means 9 for measuring the distance from a reference surface to the polished surface (insulating layer 5) to find the surface configuration of the insulating layer 5.

In FIGS. 3A and 3B, the reference character 102b designates a scrub material (a shock absorbing material for not injuring the worked surface) which is provided on the measuring side surface (bottom surface) of the monitor unit array 102 and is adapted not to injure the polished surface even if it contacts with the polished surface when the surface conditions of the polished surface are inspected. Also, the scrub material 102b surrounds the bottom surface to thereby enhance the effect of eliminating the slurry.

The reference numeral 12 denotes a water supply nozzle for supplying pure water. The water supply nozzle 12 discharges pure water to the worked surface (insulating layer) to thereby eliminate any slurry, dust, etc., attaching thereto and facilitate highly accurate detection of the surface conditions of the polished object. The reference numeral 13 designates a draining nozzle for discharging the pure water.

In the present embodiment, instead of discharging the pure water onto the polished surface, an air nozzle may be used to discharge air.

Figure 5:
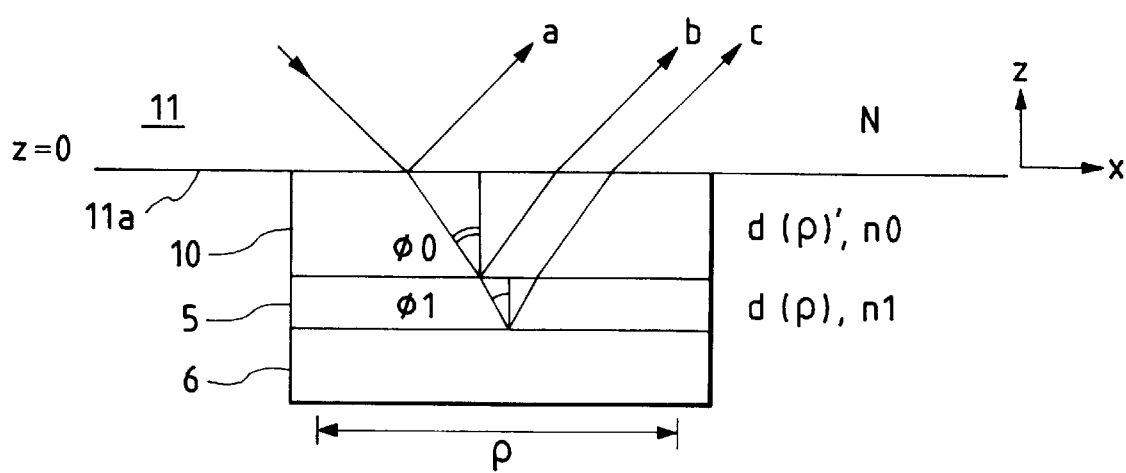
FIG. 5 is an enlarged illustration of a portion of FIG. 4.

FIG. 5 is an enlarged model view of a portion of FIG. 4, and shows the optical path when the surface configuration and film thickness of the insulating layer 5 on the silicon substrate 6 are measured by a sensor unit 102a1.

In FIG. 5, the reference numeral 10 denotes a pure water layer (or an air layer) which is produced by disposing the planar portion of a prism 11 with a position lower by the order of hundreds of $\mu$m than the surface of the polishing pad 4 as a reference surface 11a (Z=0), and circulating the pure water in the layer sandwiched between the planar portion and the insulating layer 5 by the water supply nozzle 12 and the draining nozzle 13. Here, the design is made such that the reference surface 11a is a position sufficiently longer than the film thickness of the insulating layer 5.

The construction of the film thickness measuring means 8 and distance measuring means 9 for the insulating layer contained in a sensor 102a1 and the measuring methods will now be described with reference to FIGS. 4 and 5. A description will first be made of the method of obtaining the film thickness d($\rho$) of the insulating layer by the distance measuring means 9 for measuring the distance from the reference surface to the polished surface.

The distance measuring means 9 for calculating the film thickness of the insulating layer 5 and the distance from the reference surface (the prism surface) to the polished surface (the surface of the insulating layer 5) has a light source (a semiconductor laser) 17 capable of changing the coherent distance by time division, a lens 18 for collimating a light beam emitted from the light source 17 and applying the light beam through a prism 11 to the two-dimensional area $\rho$ of the insulating layer 5 which is the object of measurement, and a lens 19 for causing the reflected light beam from the two-dimensional area $\rho$ to enter an image pickup element 20 as a divergent light beam through the prism 11.

The light beam from the light source 17 as means for changing the coherent distance by time division is a semiconductor laser of a single mode of oscillation center wavelength $\lambda_0$=780 nm, and has a sufficiently long coherent distance for the thickness of each layer which is the object of measurement.

An operation is performed to make the light source 17 into a multimode with a high frequency current cutting in a laser oscillation thresholds value by a high frequency superposing circuit so that the coherent distance may become as short as ten and several μm or less. When each layer is irradiated with a first light beam from such a light source of which the coherent distance has been shortened, there are created three reflected lights, i.e., reflected light a from the reference surface coincident with the planar portion of the prism 11, reflected light b from the boundary surface of the pure water layer 10/the insulating layer 5 (the surface of the insulating layer 5), and reflected light c from the boundary surface of the insulating layer 5/the silicon substrate 6, as shown in FIG. 5.

Since the coherent distance of the light beam from the light source is short, only the reflected lights b and c of the three reflected lights a, b and c which are short in the optical path length difference interfere with each other and the reflected light a does not interfere with the other reflected lights and becomes a direct current component. The interference intensity $I_1$ (ρ) of an interference pattern formed on the image pickup element 17 at this time is represented as follows:

$$I_1(\rho)=ua^2+ub^2+uc^2+2ubuccos(\sigma b-\sigma c) \quad (1)$$

where k is a wave number which is $2n/\lambda$. Also, σb−σc is $$\sigma b-\sigma c=k\times 2\times n_1\times d(\rho)\cos\phi_1.$$

k, $n_1$ and $\phi_1$ are known, and expression (1) varies with d(ρ), i.e., the average film thickness of the insulating layer 5 as a variable. As regards this d(ρ), the insulating layer 5 is usually formed on the silicon substrate 5 with its film thickness controlled and therefore, the rough value of d(ρ) can be predetermined, and referring to the data table or the like of the interference intensity based on d(ρ), d(ρ) is calculated by a calculating process.

On the other hand, the film thickness measuring means 8 in the present embodiment is used as required, and measures the average film thickness d(ρ) of the two-dimensional area ρ of the insulating layer 5 by spectral reflectance measurement, and has a unit 14 including a light source and a spectrometer, a half mirror 15 and a photomultiplier (photoelectric element) 16. Monochromatic light of which the wavelength continuously changes is emitted from the unit 14, and is reflected by the surface of the insulating layer 5 and the boundary surface of the insulating layer 5/the silicon substrate 6. The two light beams reflected at this time interfere with each other.

In the present embodiment, the average film thickness d(ρ) of the insulating layer 5 is obtained from the changes in the interference intensity by these two light beams. When the wavelengths when the interference intensity becomes maximum and minimum are $\lambda_1$ and $\lambda_2$ and the refractive index of the insulating layer 5 is $n_1$ and the angle of reflection on the aforementioned boundary surface is $\phi_1$, the film thickness in a minute area x within the two-dimensional area ρ is represented as $$d(x)=1/[(4n_1\cos\phi_1)(1/\lambda_2-1/\lambda_1)] \quad (2)$$

Here, the average of the film thicknesses measured at a plurality of locations in the two-dimensional area ρ is defined as d(ρ).

In this case, there is also created an interference signal by the pure water layer (or air layer) 10 and the prism 11, but these have sufficiently great thicknesses as compared with the film thickness of the insulating layer 5 which is of the order of several μm and therefore, the frequency of the interference signal becomes very high and this interference signal can be readily separated from the interference signal from the insulating layer 5.

In the present embodiment, the film thickness measuring means 8 need not be provided if the film thickness is measured by the distance measuring means 9.

A description will now be made of a case wherein the present embodiment, the distance from the reference surface to the surface of the layer (the polished surface) is found by the distance means 9 to thereby find the surface configuration of the layer 5.

From a semiconductor laser of a single mode of oscillation center wavelength $\lambda_0$=780 nm as the coherent light source 17, each layer is irradiated with a second light beam of a sufficiently long coherent distance for the thickness of each layer which is the object of measurement. Thereupon, as shown in FIG. 5, there are created the reflected light a from the reference surface coincident with the planar portion of the prism 11, the reflected light b from the boundary surface of the pure water layer 10/the insulating layer 5 (the surface of the insulating layer 5) and the reflected light c from the boundary surface of the insulating layer 5/the silicon substrate 6, and these three reflected lights interfere with one another to form an interference pattern of interference intensity $I_2(\rho)$ on the image pickup element 17.

Assuming that the respective reflected lights are $a=uae^{i\sigma a}$, $b=ube^{i\sigma b}$ and $c=uce^{i\sigma c}$, the interference intensity $I_2$ (ρ) thereof is represented as follows:

$$I_2(\rho)=ua^2+ub^2+uc^2+2uaubcos(\sigma a-\sigma b)+2uauccos(\sigma a-\sigma c)+2ubuccos(\sigma b-\sigma c) \quad (3)$$

The difference between the two interference intensities obtained by time division is as shown by the following expression (4):

$$I_2(\rho)-I_1(\rho)=2uaubcos(\sigma a-\sigma b)+2uauccos(\sigma a-\sigma c) \quad (4)$$

When here, the thickness of the pure water layer 10, i.e., the distance from the reference surface to the polished surface, is d(ρ)' and the refractive index of the pure water layer 10 is $n_0$ and the angle of reflection on the boundary surface of the pure water layer 10/the insulating layer 5 is $\phi_0$ and the refractive index of the material of the prism 11 is N and the center wavelength of the oscillation spectrum of the light source 14 is λ and $k=2\pi/\lambda$, $$\sigma a-\sigma b=k[2n_0d(\rho)'\cos\phi_0]$$

and $$\sigma a-\sigma c=k[2n_0d(\rho)'\cos\phi_0+2n_1d(\rho)\cos\phi_1].$$

Here, $n_0$, $n_1$, $\phi_0$, $\phi_1$ and d(ρ) are known from expression (3) and therefore, expression (4) showing the difference between the two interference intensities varies with d(ρ)', i.e., the aforementioned distance from the reference surface to the polished surface, as a variable. By calculating this d(ρ)' by a calculating process, the surface configuration of the polished surface is calculated.

In the present embodiment, the film thickness distribution and the surface configuration measurement value of the polished surface found by such a method and apparatus are stored in a memory portion during each measurement and the differential from the film thickness distribution which is the final target is compared. When this differential is not within a predetermined range of value, control is effected so that the polishing rate, the slurry density in the polishing liquid, the temperature of the polished surface, the polishing pressure distribution, etc., are appropriately corrected from the differential value and the surface configuration measurement value and the polishing of portions of which the flattening is improper is efficiently expedited.

After the work of comparing this differential is repeated a plurality of times, the polishing work is terminated when this differential falls within a predetermined range of value.

Figure 6:
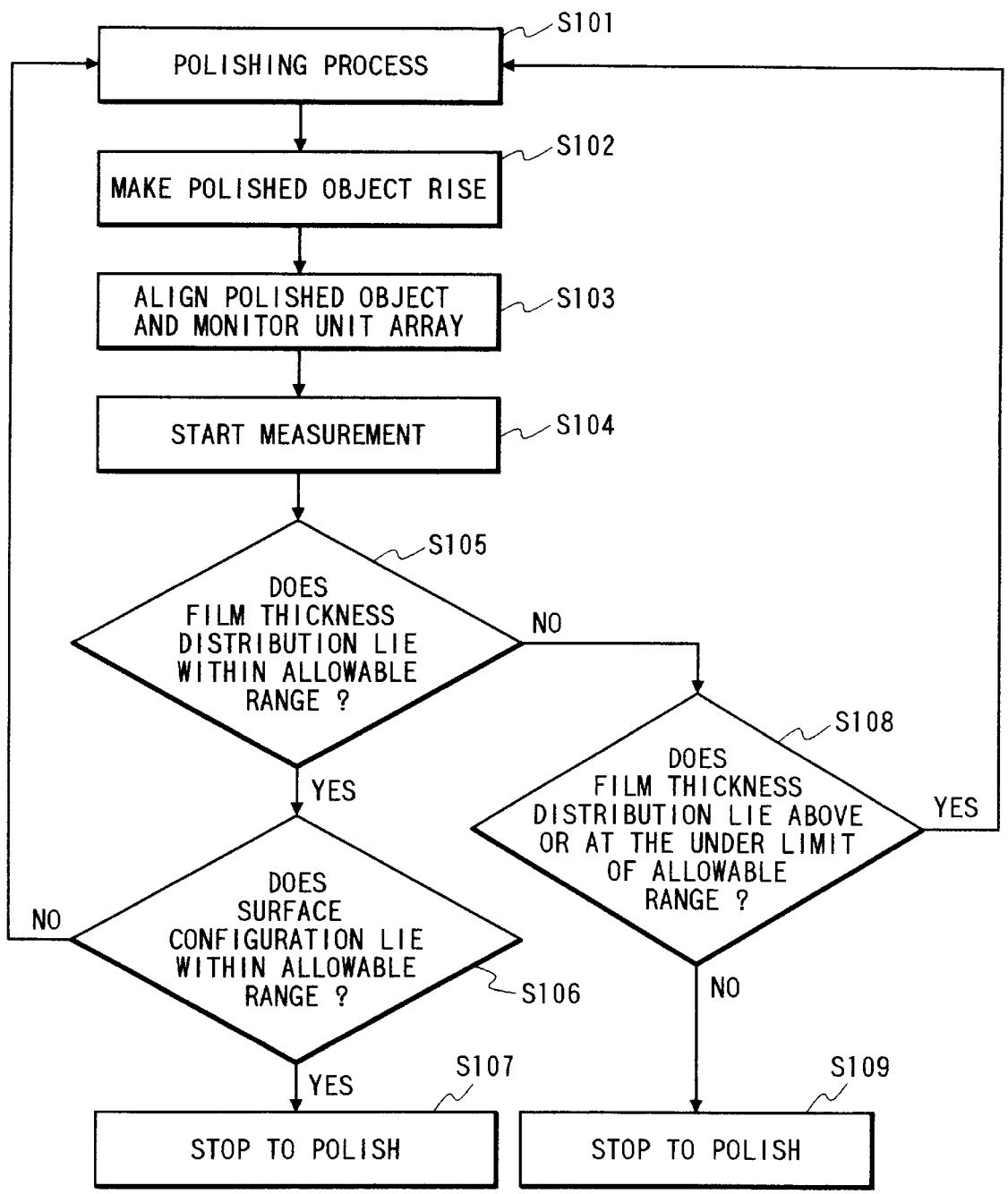
FIG. 6 is a flow chart of the operation of Embodiment 1 of the present invention.

The flow of the detection of the termination point of the flattening work by the chemical and mechanical polishing of the present embodiment is shown in FIG. 6 and will be described below.

[Step 101 (S101)]

The partial polishing tool 4 and the polished object 101 are driven relative to each other to thereby chemically-mechanically polish the polished object.

[Step 102 (S102)]

The partial polishing tool 4 and the polished object 101 are separated from each other, the polished object 101 is positioned under the monitor unit array 102, and the polished object 101 is elevated to the monitor unit array 102 side.

[Step 103 (S103)]

The monitor unit array 102 and the polished object 101 are aligned with each other.

[Step 104 (S104)]

By the monitor unit array 102, the film thickness and surface configuration of the polished object 101 are measured by the aforedescribed method while the polished object 101 is rotated, and the film thickness distribution and surface configuration value of the polished surface are stored in the memory portion during each measurement.

[Step 105 (S105)]

Whether both of the maximum film thickness dmax and the minimum film thickness dmin of the measured film thickness distribution are within an allowable range (the upper limit film thickness STU and the lower limit film thickness STL) is determined, and if they are within the allowable range, advance is made to step 106, and if they are outside the allowable range, advance is made to step 108.

[Step 106 (S106)]

Whether the measured surface configuration is within an allowable range is determined. That is, the measured unevenness of the surface of the polished object is made into a numerical value representative of the surface roughness such as dispersion from the peak-and-valley value and the mean value, and whether the numerical value is within a preset allowable range is determined. If the numerical value is within the allowable range, advance is made to step 107, and if the numerical value is outside the allowable range, return is made to step 101.

[Step 107 (S107)]

The subsequent polishing of the polished object is stopped.

[Step 108 (S108)]

Whether the measured film thickness distribution is within the lower limit of the allowable range is determined. That is, whether the minimum film thickness dmin of the measured film thickness distribution is equal to or less than the lower limit film thickness STL is determined. If the minimum film thickness dmin is less than the lower limit film thickness STL, advance is made to step 109, and if the minimum film thickness dmin is equal to or greater than the lower limit film thickness STL, return is made to step 101.

[Step 109 (S109)]

The subsequent polishing of the polished object is stopped.

In the present embodiment, the single mode semiconductor laser 17 as means for making the coherent distance of the light source different is made into a multimode by a high frequency superposing circuit and is time-divided to thereby effect the aforedescribed measurement of $I_1(\rho)$ and $I_2(\rho)$, but alternatively, two light sources differing in coherent distance from each other may be spatially separately disposed and two image pickup elements corresponding thereto may be provided so that the aforedescribed measurement of $I_1(\rho)$ and $I_2(\rho)$ may be effected.

Also, in the distance measuring means 9 for measuring the distance from the reference surface to the polished surface, the angle of incidence of the irradiating light beam may be 0° (parallel to the Z-axis) and the film thickness measuring means 8 for measuring the film thickness of the insulating layer 5 and the optical path may be partly common to each other.

Figure 7A:
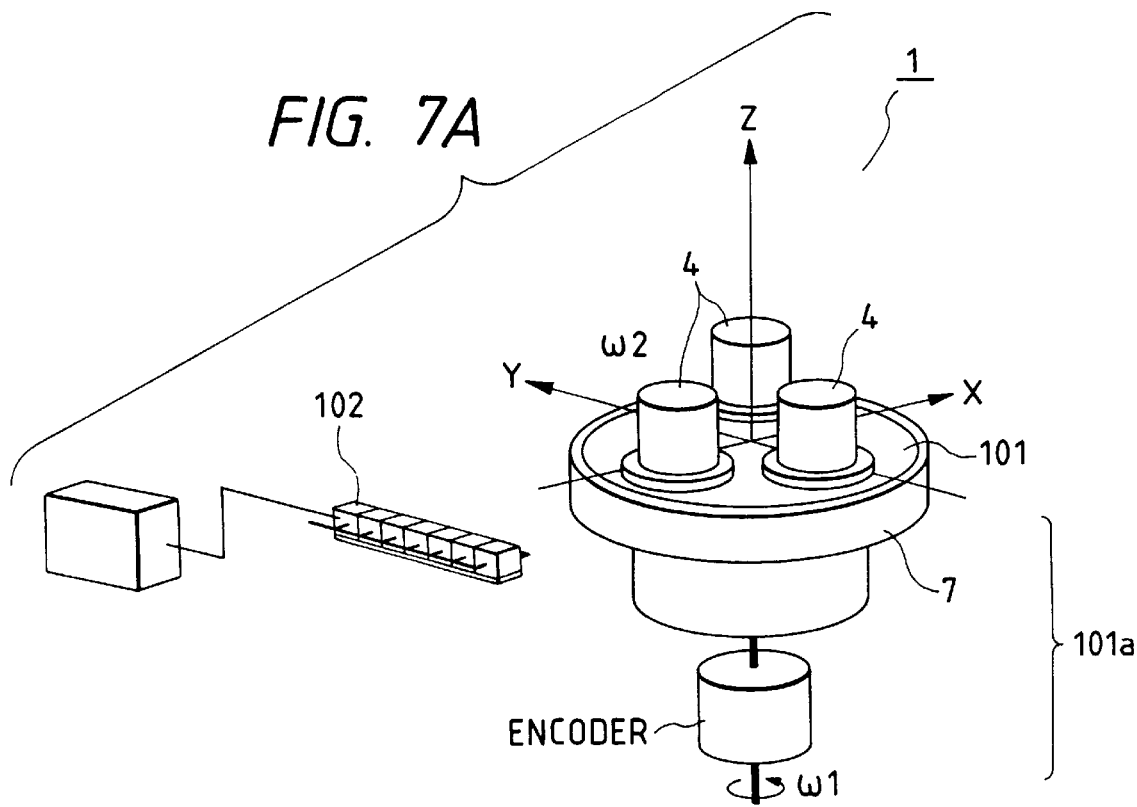
FIGS. 7A and 7B are schematic views of the essential portions of Embodiment 2 of the present invention.
Figure 7B:
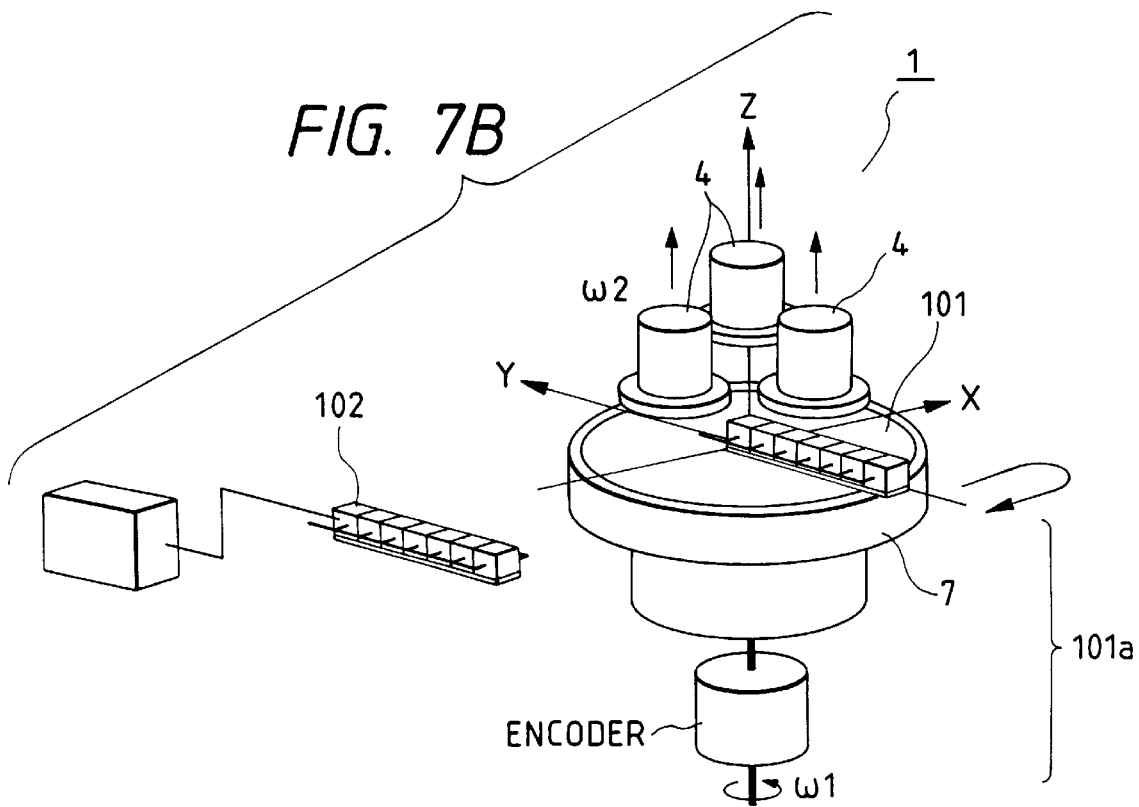

FIGS. 7A and 7B are schematic views of the essential portions of Embodiment 2 of the present invention. In these figures, the same elements as those shown in FIG. 1 are given the same reference characters. This embodiment differs from the embodiment of FIG. 1 in that the supporting portion 101a on the substrate holder 7 side is fixed and the sensor unit array 102 is movable in the X direction, and is the same as the embodiment of FIG. 1 in the other points.

In the present embodiment, the sensor unit array 102 is moved onto the surface of the polished object 101 in the space formed by the partial polishing tool 4 being moved in the Z-axis direction after the elapse of a predetermined polishing time and the partial polishing tool 4 being moved, whereby the surface conditions are found at a plurality of locations on the polished object 101, and thereby there is obtained an effect similar to that of Embodiment 1.

Figure 8A:
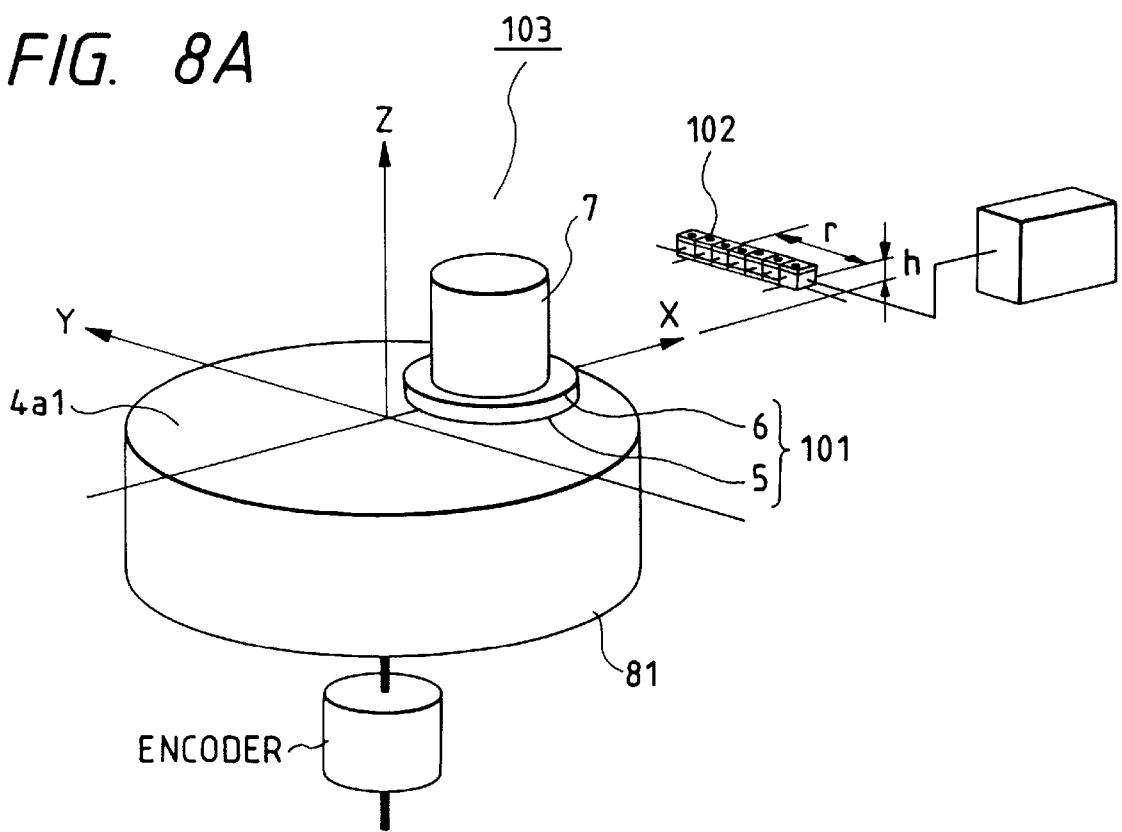
FIGS. 8A and 8B are schematic views of the essential portions of Embodiment 3 of the present invention.
Figure 8B:
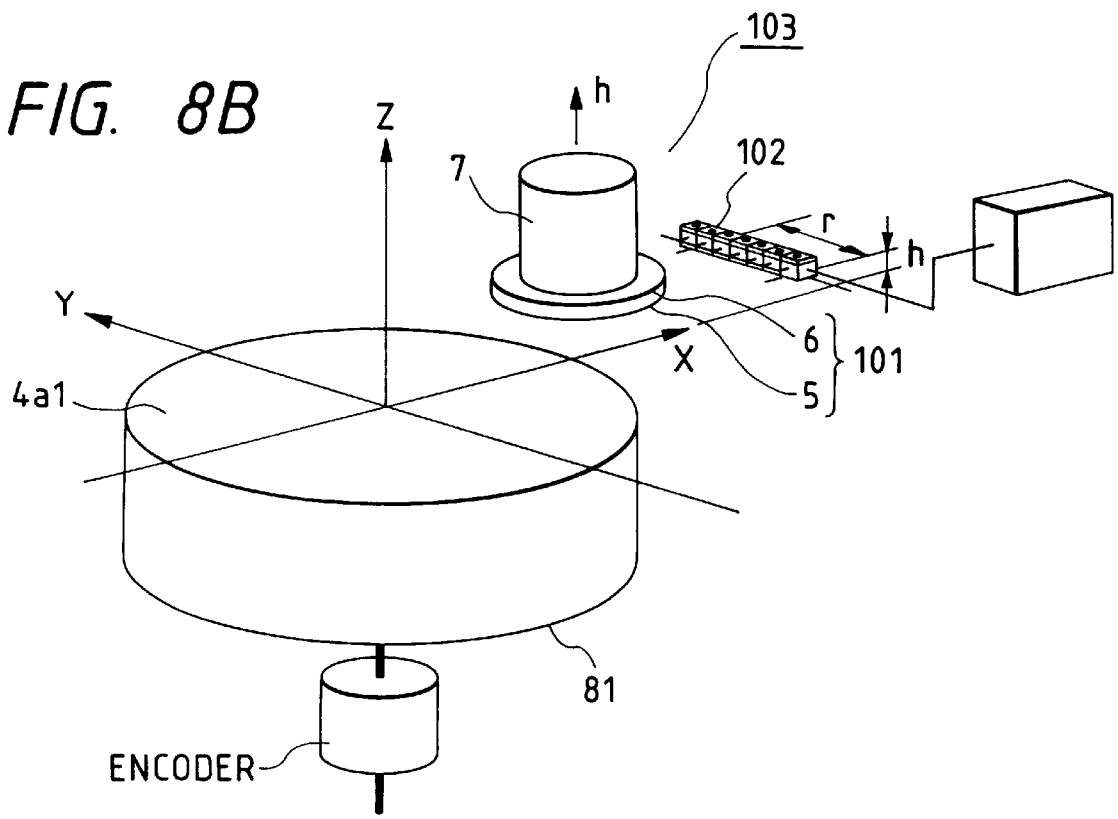

FIGS. 8A and 8B are schematic views of the essential portions of Embodiment 3 of the present invention. In these figures, the same elements as those shown in FIG. 1 are given the same reference characters.

This embodiment differs from Embodiment 1 of FIG. 1 in that the polishing opening in the polishing pad 4a1 is larger than the insulating layer 5 provided on the silicon substrate 6 as the polished object 101 and the whole of the insulating layer 5 is polished, and is the same as Embodiment 1 in the other points of the basic construction.

In FIGS. 8A and 8B, the reference numeral 81 designates a polishing stool which protects the polishing pad 4a1. The reference numeral 103 denotes a holding member having a substrate holder 7 and a polished object 101 held thereby.

In the present embodiment, after the elapse of a predetermined polishing time, the holding member 103 is moved by a distance h in the Z direction to thereby separate the substrate holder 7 and the polishing pad 4a1 from each other, whereafter the holding member 103 is moved in the X direction and disposed in an opposed relationship with the fixed monitor unit array 102. Then, the surface conditions of the insulating layer 5 applied to the silicon substrate 6 are found by the monitor unit array 102 in the same way as Embodiment 1. In the other points, the construction of the present embodiment is the same as that of Embodiment 1.

Figure 9A:
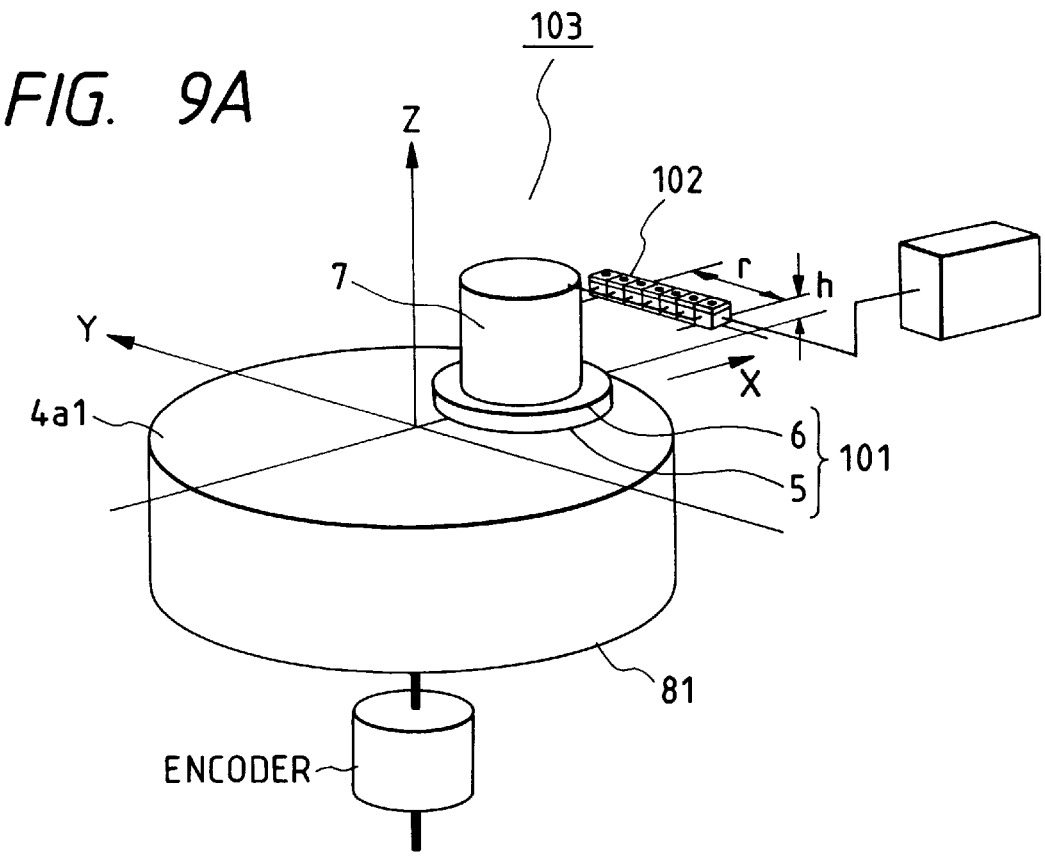
FIGS. 9A and 9B are schematic views of the essential portions of Embodiment 4 of the present invention.
Figure 9B:
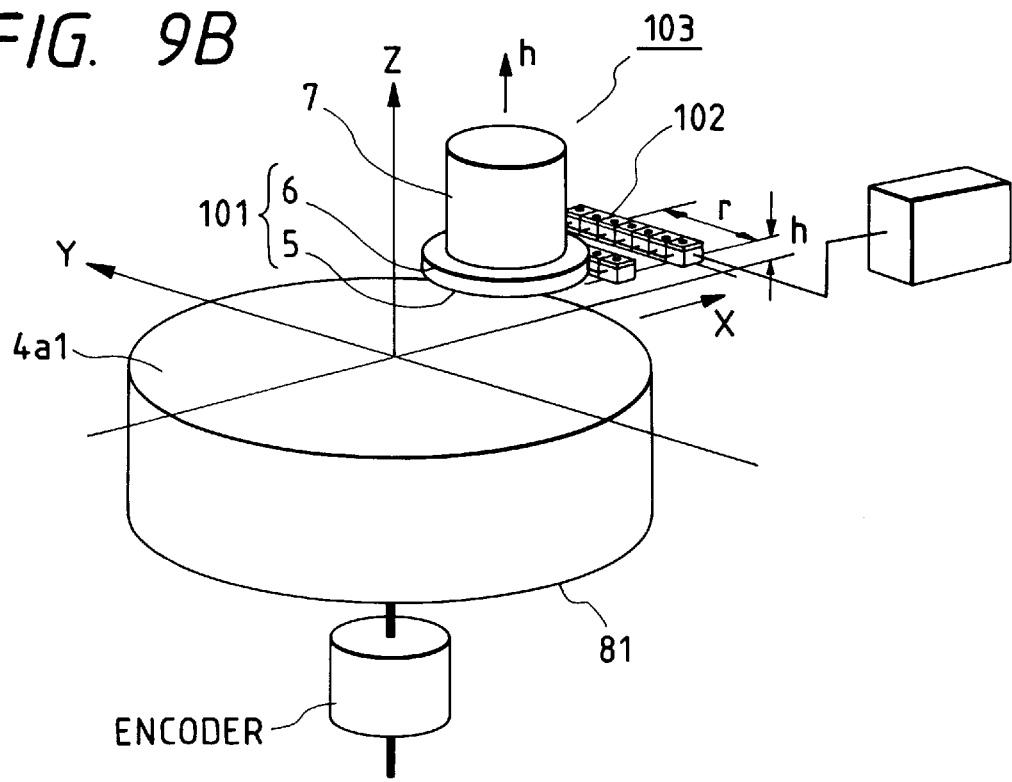

FIGS. 9A and 9B are schematic views of the essential portions of Embodiment 4 of the present invention. In these figures, the same elements as those shown in FIG. 8 are given the same reference numerals. In this embodiment, as compared with Embodiment 3 of FIGS. 8A and 8B, the holding member 103 on the substrate holder 7 side is movable only in the Z direction and the monitor unit array 102 is movable in the X direction.

The monitor unit array 102 is moved into the space formed by the holding member 103 being moved by a distance h in the Z direction, and the surface conditions are found at a plurality of locations on the polished object 101. In the other points, the construction of the present embodiment is the same as that of Embodiment 1.

Figure 10:
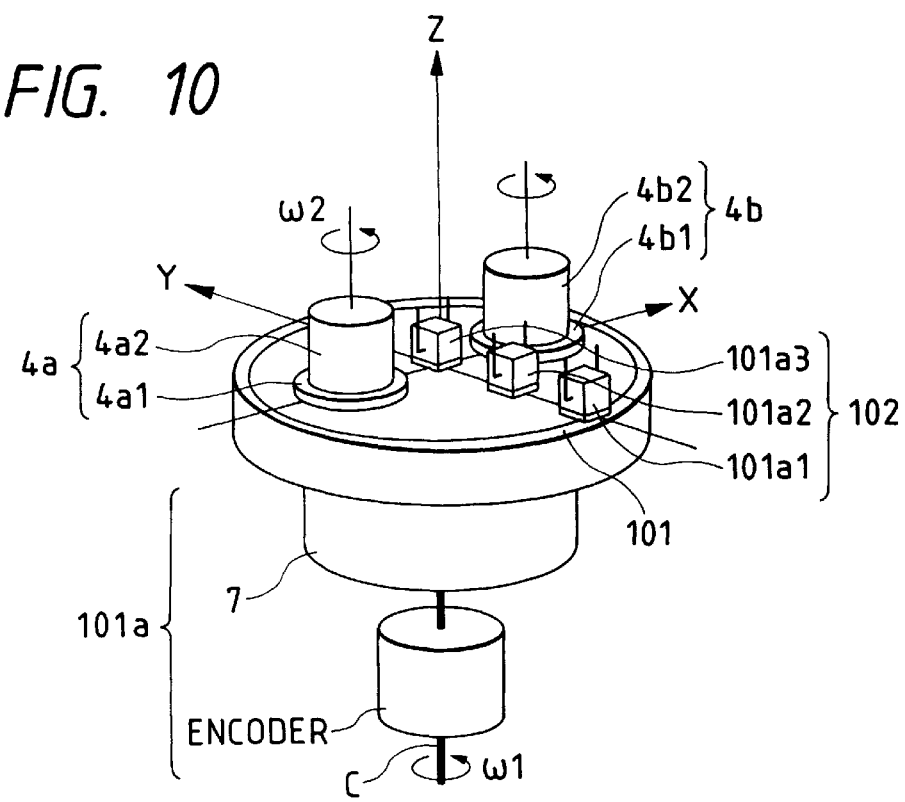
FIG. 10 is a schematic view of the essential portions of Embodiment 5 of the present invention.

FIG. 10 is a schematic view of the essential portions of Embodiment 5 of the present invention. In this figure, the same elements as those shown in FIG. 1 are given the same reference characters.

This embodiment differs from Embodiment 1 of FIG. 1 in that the sensor unit array 102 is disposed in an area which does not hamper the polishing operation of the partial polishing tools 4a and 4b so that the surface conditions at a plurality of locations on the polished object 101 can be found at any time during the polishing process, and is the same as Embodiment 1 in the other points.

The present embodiment obtains the effect that the termination point of the polishing process can be found more accurately and quickly by obtaining the surface conditions of the polished object 101 during the polishing operation.

Figure 11:
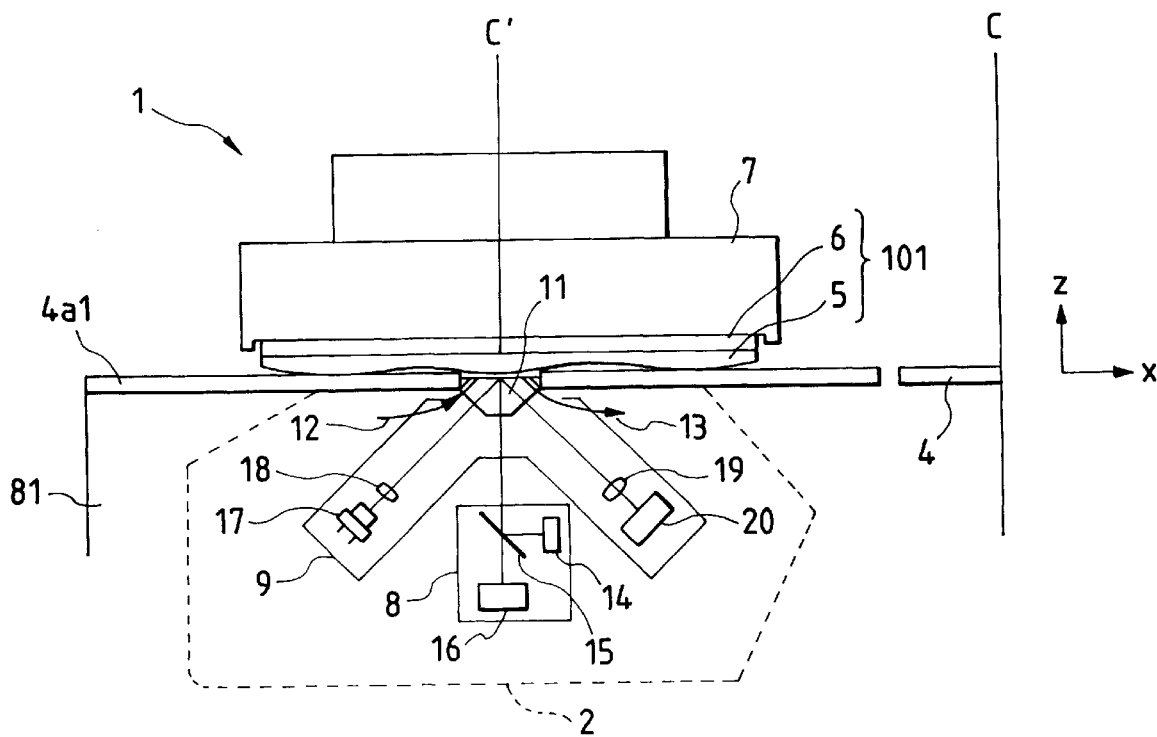
FIG. 11 is a schematic view of the essential portions of Embodiment 6 of the present invention.

FIG. 11 is a schematic view of the essential portions of Embodiment 6 of the present invention. In this figure, the same elements as those shown in FIGS. 1, 8A and 8B are given the same reference numerals.

This embodiment differs from Embodiment 3 of FIGS. 8A and 8B in that the sensor unit array 102 is eliminated and instead of it, a sensor 2 similar in construction to the sensor 102a1 is provided in the interior of the polishing stool 8 so that the surface information of the insulating layer 5 even in a liquid by the sensor 2 through an aperture portion provided in a portion of the polishing pad 4a1 and that during the detection, the polished object 101 is not moved toward the monitor unit array located afar, and in the other points, the basic construction of this embodiment is the same as that of Embodiment 3.

In the present embodiment, the polished object 101 is moved in the XY direction on the polishing pad 4a1 and then position thereof is found by an encoder (not shown) or the like, and the two-dimensional surface information of the insulating layer 5 at that position is detected by the sensor 2.

In the present embodiment, the surface information of the insulating layer 5 of the polished object 101 can be measured even when it is in a liquid, whereby the throughput is improved.

Figure 12:
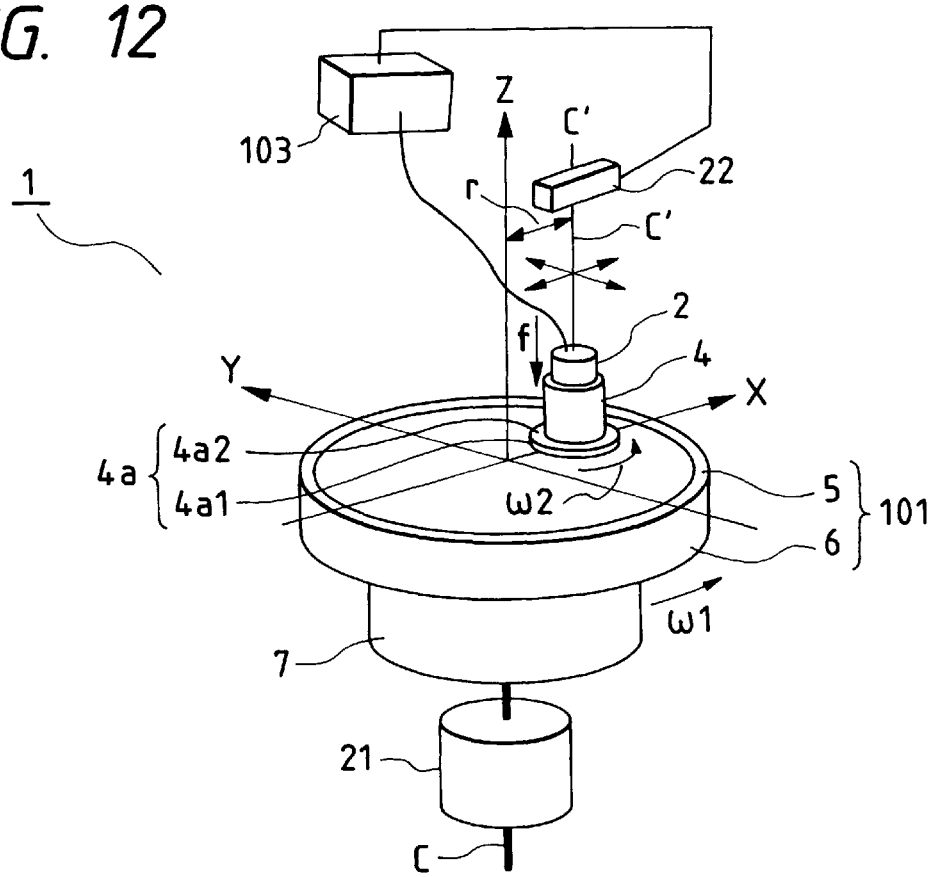
FIG. 12 is a schematic view of the essential portions of Embodiment 7 of the present invention.

FIG. 12 is a schematic view of the essential portions of Embodiment 7 of the present invention. In FIG. 12, the reference numeral 1 designates a chemical and mechanical polishing apparatus. FIG. 12 shows the manner in which the surface of the polished object 101 is polished. In this figure, the same elements as those shown in FIG. 1 are given the same reference numerals.

Figure 13:
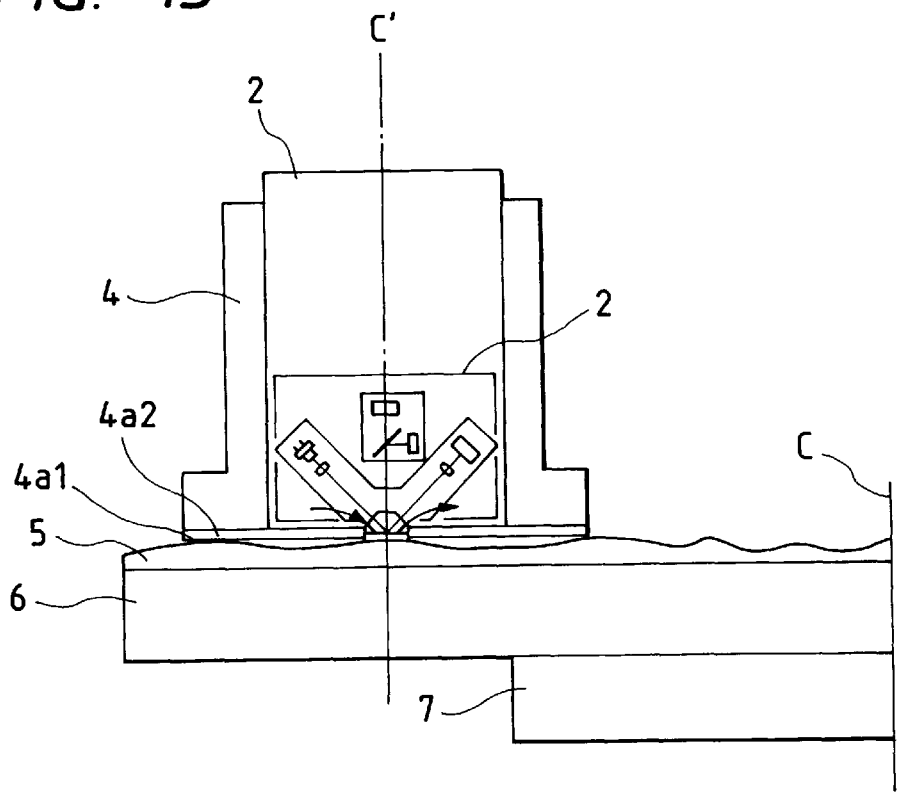
FIG. 13 is a schematic view of the essential portions of FIG. 12.

FIG. 13 is a schematic view of the partial polishing tool 4 of FIG. 12. A sensor 2 is fixedly held in the interior of the partial polishing tool 4. The sensor 2 is a detecting head which is means for measuring the film thickness and the surface configuration of the polished surface simultaneously. The sensor 2 is hermetically provided in the partial polishing tool 4 to thereby prevent the adherence of slurry, dust, etc., during the polishing process. The sensor 2, together with control means 103 which will be described later, detects the surface information (surface configuration and film thickness distribution) of the polished object 101. The control means 103 controls, on the basis of the detection result of the surface information of the polished object 101, the termination point of the polishing process for the polished object 101 or whether the polishing process should be continued or not.

The polished object 101 comprises an insulating layer (film layer) 5 formed on a silicon substrate, and is held by a substrate holder 7.

In the present embodiment, the insulating layer 5 on the silicon substrate 6 is partially chemically-mechanically polished by the partial polishing tool 4. The substrate holder 7 holds the polished object 101 and is rotated at an angular speed $\omega1$ about the rotary shaft C by drive means (not shown). In FIG. 13, the rotary shaft C is the Z-axis and a plane orthogonal thereto is the X, Y plane.

The partial polishing tool 4 has a polishing pad 4a1 and a holder 4a2 holding the polishing pad 4a1, and is rotated at an angular speed $\omega2$ about the rotary shaft C' by drive means (not shown). In FIG. 13, there is shown a case where the insulating layer 5 on the silicon substrate 6 is being partially polished by a polishing pad 4a1. A plurality of partial polishing tools 4 may also be used.

Figure 14:
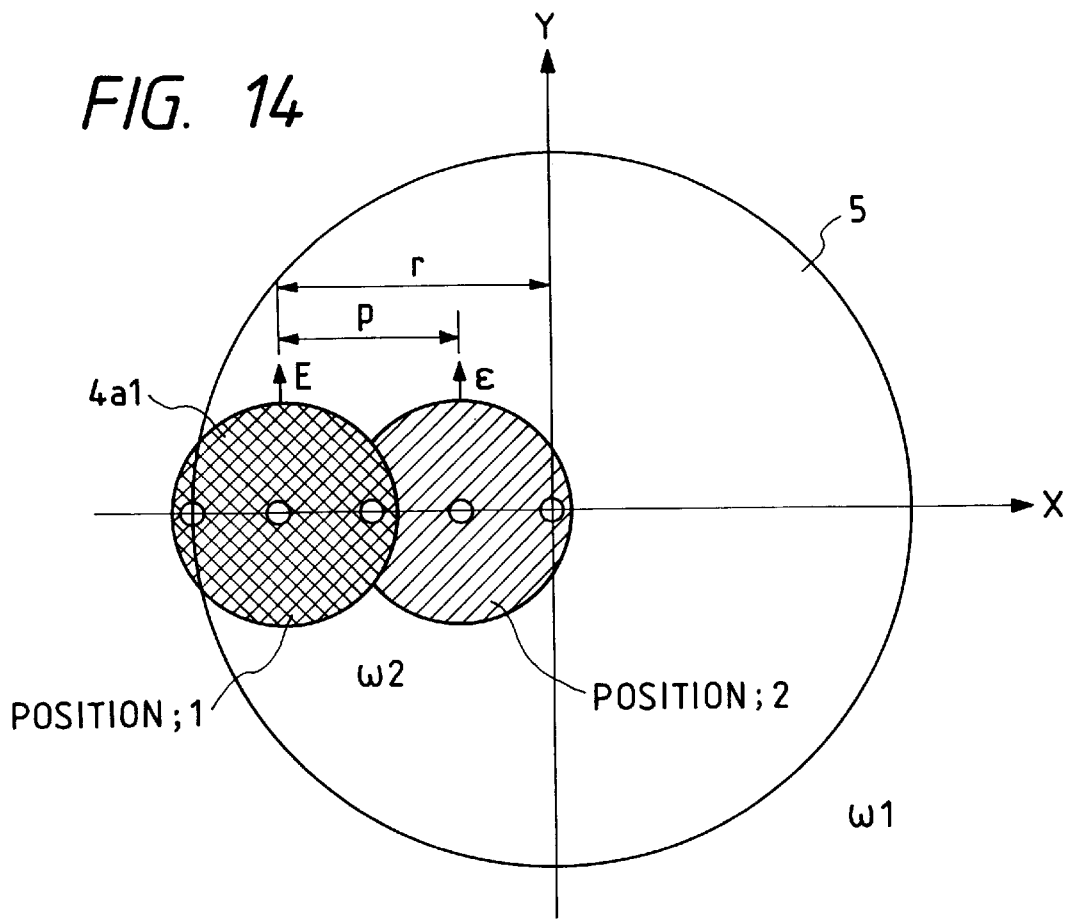
FIG. 14 is a schematic view of a portion of FIG. 12.

In the present embodiment, as shown in FIG. 14, the polishing opening in the polishing pad 4a1 is smaller than the polished surface (insulating layer) 5 of the polished object 101. Thereby, the insulating layer 5 is partially polished. The partial polishing tool 4, as shown in FIG. 14, is at a distance $\gamma$ in the X-axis direction from the Z-axis, and is movable by a distance $\rho$ from position 1 to position 2 on the X-axis. The reference numeral 22 designates a linear encoder which detects the positional information of the partial polishing tool 4 in the X-axis direction.

The reference numeral 21 denotes a rotary encoder which detects the rotational information of the rotary shaft C. The surface conditions such as the surface configuration and film thickness distribution of the insulating layer 5 on the silicon substrate 6 are inspected by a method which will be described later with the aid of the sensor 2.

In the present embodiment, when the surface of the insulating layer 5 is to be polished, the partial polishing tool 4 is rotated about the rotary shaft C' and also the substrate holder 7 is rotated about the shaft C, and both are driven relative to each other and slurry including a polishing material is caused to flow out from a nozzle (not shown) onto the surface of the polished object 101 while the relative position of both in the X direction and Y direction is displaced as required, whereby the slurry is uniformly supplied to the interface between the insulating layer 5 and the polishing pad 4a1.

At this time, polishing is done with the ratio between the pressure and the number of revolutions of the insulating layer 5 and the partial polishing tool 4 and the quantity of slurry supplied being appropriately selected. Thereby, the insulating layer 5 formed on the silicon substrate 6 is partially polished by the partial polishing tool 4 to flatten the surface thereof.

After the surface of the insulating layer 5 is partially polished for a preset time, the film thickness and surface position information of the insulating layer 5 are measured by a method which will be described later with the aid of the sensor 2 provided in the partial polishing tool 4, as shown in FIG. 13.

In the present embodiment, the surface conditions of the insulating layer 5 of the polished object 101 can be measured even when it is in the liquid, whereby the throughput is improved.

Next, on the basis of an output signal obtained from the sensor 2 by a method which will be described later, the surface conditions such as the surface configuration and film thickness distribution of the entire insulating layer 5 are found by the control means 103. At this time, the control means 103 judges by a determining portion whether both of the surface configuration such as unevenness or level difference and the film thickness distribution of the surface of the insulating layer 5 are within a present range. If both are within the preset range, it is judged that the termination point of polishing has been reached, and the polishing process is stopped. If not so, the control means 103 controls so as to continue the polishing process again.

The control means 103 is adapted to stop the polishing process when it judges during the polishing process that both of the surface configuration and film thickness distribution of the insulating layer 5 are not within the preset range (for example, when the insulating layer has been polished too much and has become too thin). At this time, the polished object 101 is judged to be a bad article.

As described above, in the present embodiment, the insulating layer 5 on the silicon substrate is flattened, whereby when projection exposure is done, the entire area of the insulating layer 5 which is the object falls within the depth of focus of the projection optical system. Also, design is made such that the film thickness of the insulating layer 5 is within a predetermined range to thereby prevent the irregularity of the inter-layer volume and also unify the depth of a through hole.

Figure 15:
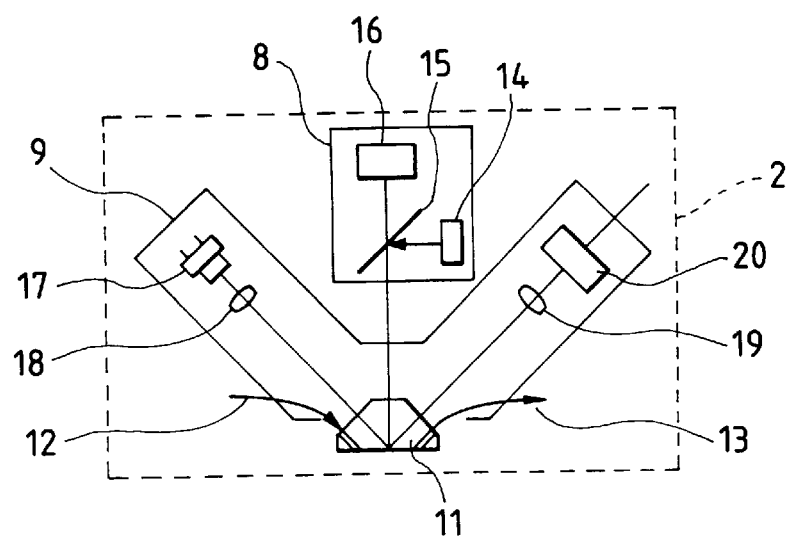
FIG. 15 is a schematic view of the essential portions of a sensor according to the present invention.

FIG. 15 is a schematic view of the essential portions of the sensor 2 in the present embodiment. The sensor 2 has film thickness measuring means 8 for measuring the film thickness of the insulating layer 5 on the silicon substrate 6, and distance measuring means 9 for measuring the distance from the reference surface to the polished surface (the insulating layer 5) to find the surface configuration of the insulating layer 5.

FIGS. 17A and 17B are schematic views of the partial polishing tool 4 as it is seen from below the Z-axis (the rotary encoder 21 side). In FIG. 17A, the polishing pad 4$a$1 is provided outside a prism area 11 including the reference surface, whereby the whole surface is polished. FIG. 17B shows a case where the polishing pad 4$a$1 is made into a zonal shape except the prism area 11 including the reference surface and zonal polishing is done. In FIG. 17B, the reference numeral 61 designates a shock absorbing member (scrub member) free of the polishing effect.

The scrub member 61 is a member for forming a closed space so that the return of pure water or air for the elimination of the slurry can be effected efficiently, and the material thereof is Nylon, polyvinyl foamed material or the like which is hydrophilic and good in wear resistance.

In the present embodiment, the construction of FIG. 17A or FIG. 17B is used in conformity with the object.

Figure 18A:
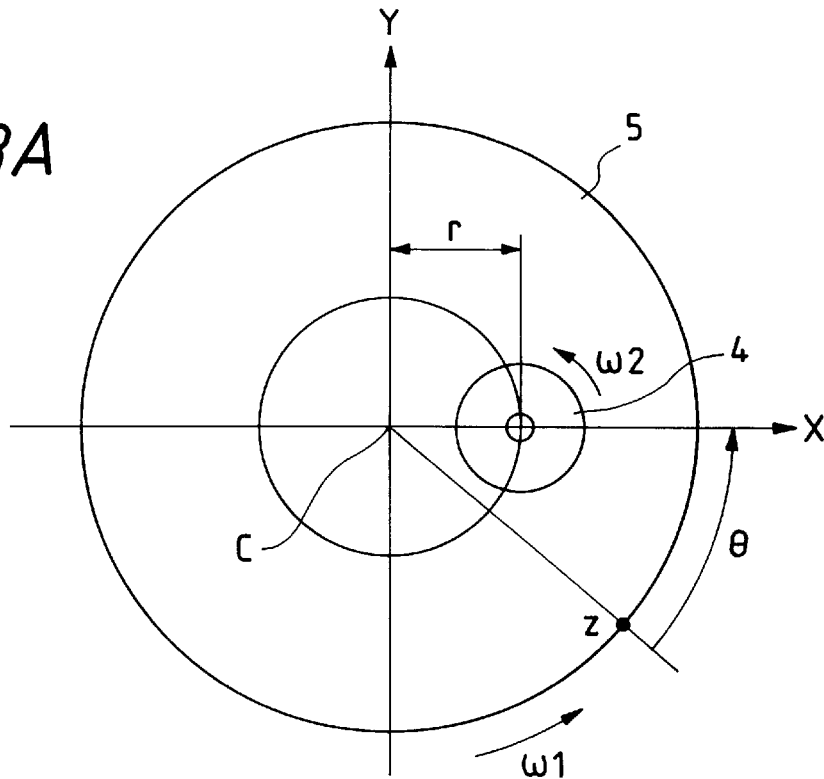
FIGS. 18A and 18B are illustrations of a measuring method according to Embodiment 7 of the present invention.
Figure 18B:
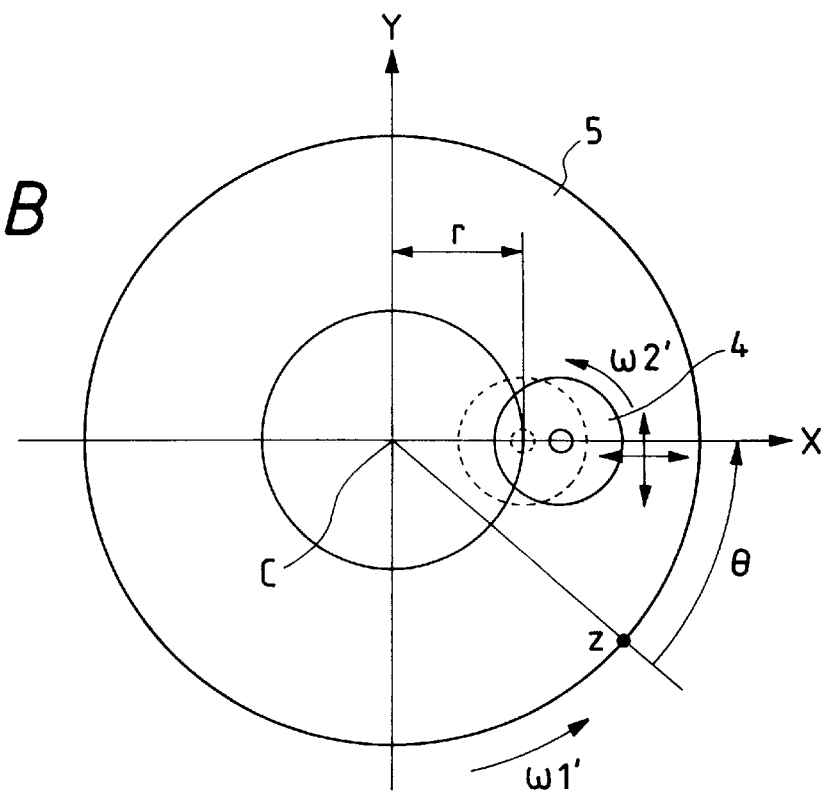

FIGS. 18A and 18B are illustrations showing the positional relationship when the film thickness and surface position information of the insulating layer 5 of the polished object 101 at each position in the present embodiment are measured by the sensor 2 provided in the partial polishing tool 4.

In FIG. 18A, the partial polishing tool 4 is driven and controlled to a position γ in the X direction by the use of the linear encoder 22 while the rotated position ι of the insulating layer 5 is driven and controlled by the use of the rotary encoder 21. The position information (the distance γ from the rotary shaft C and the angle θ) of the insulating layer 5 and the partial polishing tool 4 is stored, and the surface position information of the insulating layer 5 at that position is detected by the sensor 2 and is stored in a memory portion (not shown) in the control means 103.

Then, as shown in FIG. 18B, the partial polishing tool 4 is moved by a predetermined amount in the X-axis direction by the use of the linear encoder 22, and as in FIG. 18A, the surface position information at that position is detected and is stored in the memory portion. The surface position information is found over the entire surface of the insulating layer 5 with the value of the angle θ being variously changed, whereby the film thickness distribution and surface configuration of the entire insulating layer 5 are found.

FIG. 16 is an enlarged model view of a portion of FIG. 15, and shows the optical path when the surface configuration and film thickness of the insulating layer 5 on the silicon substrate 5 are measured by the sensor 2.

The construction of the film thickness measuring means 8 for the insulating layer and the distance measuring means 9 for the distance from the reference surface to the polished surface which are possessed by the sensor 2 and the measuring methods thereof will now be described with reference to FIGS. 15 and 16. A description will first be made of the method of obtaining the film thickness d(ρ) of the insulating layer 5 by the distance measuring means 9.

The distance measuring means 9 for calculating the film thickness of the insulating layer 5 and the distance from the reference surface (the prism surface) to the polished surface (the surface of the insulating layer 5) has a light source (semiconductor laser) 17 of which the coherent distance can be changed by time division, a lens 18 for collimating a light beam emitted from the light source 17 and applying it through the prism 11 to the two-dimensional area ρ of the insulating layer 5 which is the object of measurement, and a lens 19 for causing the reflected light beam from the two-dimensional area ρ to enter an image pickup element 20 as a divergent light beam through the prism 11.

In FIG. 15, the reference numeral 12 designates a water supply nozzle for pure water supply which discharges pure water to the polished surface (the insulating layer) to thereby remove the slurry, dust, etc., adhering thereto and facilitate the highly accurate detection of the surface conditions of the polished object. The reference numeral 13 denotes a draining nozzle for discharging the pure water.

In the present embodiment, instead of discharging the pure water onto the polished surface, an air nozzle may be used to discharge air.

In FIG. 16, the reference numeral 10 designates a pure water layer (or an air layer) which is produced by disposing the planar portion of the prism 11 with a position lower by the order of hundreds of μm than the surface of the polishing pad 4 as a reference surface 11$a$ (Z=0), and circulating the pure water in the layer sandwiched between the planar portion and the insulating layer 5 by the water supply nozzle 12 and the draining nozzle 13. Here, design is made such that the reference surface hla is a position sufficiently longer than the film thickness of the insulating layer 5.

The light beam from the light source 17 as means for changing the coherent distance by time division is a semiconductor laser of a single mode of oscillation center wavelength $\lambda_0$=780 nm, and has a sufficiently long coherent distance for the thickness of each layer which is the object of measurement.

An operation is performed to make the light source 17 into a multimode with a high frequency current cutting in a laser oscillation threshold value by a high frequency superposing circuit, not shown, so that the coherent distance may become as short as ten and several μm or less. When each layer is irradiated with a first light beam from such a light source of which the coherent distance has been shortened, there are created three reflected lights, i.e., reflected light a from the reference surface coincident with the planar portion of the prism 11, reflected light b from the boundary surface of the pure water layer 10/the insulating layer 5 (the surface of the insulating layer 5), and reflected light c from the boundary surface of the insulating layer 5/the silicon substrate 6, as shown in FIG. 16.

Since the coherent distance of the light beam from the light source is short, only the reflected lights b and c of the three reflected lights a, b and c which are short in the optical path length difference interfere with each other and the reflected light a does not interfere with the other reflected lights and becomes a direct current component. The interference intensity $I_1(\rho)$ of an interference pattern formed on the image pickup element 17 at this time is represented as follows:

$$I_1(\rho)=ua^2+ub^2+uc^2+2ubuc\cos(\sigma b-\sigma c) \quad (1)$$

where k is a wave number which is $2n/\lambda$. Also, $\sigma b-\sigma c$ is $$\sigma b-\sigma c=k\times 2\times n_1\times d(\rho)\cos\phi_1.$$

k, $n_1$ and $\phi_1$ are known, and expression (1) varies with $d(\rho)$, i.e., the average film thickness of the insulating layer 5 as a variable. As regards this $d(\rho)$, the insulating layer 5 is usually formed on the silicon substrate 6 with its film thickness controlled and therefore, the rough value of $d(\rho)$ can be predetermined and referring to the data table or the like of the interference intensity based on $d(\rho)$, $d(\rho)$ is calculated by a calculating process.

On the other hand, the film thickness measuring means 8 in the present embodiment is used as required, and measures the average film thickness $d(\rho)$ of the two-dimensional area $\rho$ of the insulating layer 5 by spectral reflectance measurement, and has a unit 14 including a light source and a spectrometer, a half mirror 15 and a photomultiplier (photoelectric element) 16. Monochromatic light of which the wavelength continuously changes is emitted from the unit 14, and is reflected by the surface of the insulating layer 5 and the boundary surface of the insulating layer 5/the silicon substrate 6. The two light beams reflected at this time interfere with each other.

In the present embodiment, the average film thickness $d(\rho)$ of the insulating layer 5 is obtained from the changes in the interference intensity by these two light beams. When the wavelength when the interference intensity becomes maximum and minimum are $\lambda_1$ and $\lambda_2$ and the refractive index of the insulating layer 5 is $n_1$ and the angle of reflection on the aforementioned boundary surface is $\phi_1$, the film thickness in a minute area x within the two-dimensional area $\rho$ is represented as $$d(x)=1/[(4n_1\cos\phi_1)(1/\lambda_2-1/\lambda_1)]. \quad (2)$$

Here, the average of the film thicknesses measured at a plurality of locations in the two-dimensional area $\rho$ is defined as $d(\rho)$.

In this case, there is also created an interference signal by the pure water layer (or air layer) 10 and the prism 11, but these have sufficiently great thicknesses as compared with the film thickness of the insulating layer 5 which is of the order of several $\mu m$ and therefore, the frequency of the interference signal becomes very high and this interference signal can be readily separated from the interference signal from the insulating layer 5.

In the present embodiment, the film thickness measuring means 8 need not be provided if the film thickness is measured by the distance measuring means 9.

A description will now be made of a case where in the present embodiment, the distance from the reference surface to the surface of the layer (the polished surface) is found by the distance measuring means 9 to thereby find the surface configuration of the layer 5.

From a semiconductor laser of a single mode of oscillation center wavelength $\lambda_0=780$ nm as the coherent light source 17, each layer is irradiated with a second light beam of a sufficiently long coherent distance for the thickness of each layer which is the object of measurement. Thereupon, as shown in FIG. 16, there are created the reflected light a from the reference surface coincident with the planar portion of the prism 11, the reflected light b from the boundary surface of the pure water layer 10/the insulating layer 5 (the surface of the insulating layer 5) and the reflected light c from the boundary surface of the insulating layer 5/the silicon substrate 6, and these three reflected lights interfere with one another to form an interference pattern of interference intensity $I_2(\rho)$ on the image pickup element 17.

Assuming that the respective reflected lights are $a=ua\ e^{i\sigma a}$, $b=ub\ e^{i\sigma b}$ and $c=uc\ e^{i\sigma c}$, the interference intensity $I_2(\rho)$ thereof is represented as follows:

$$I_2(\rho)=ua^2+ub^2+uc^2+2uaub\cos(\sigma a-\sigma b)+2uauc\cos(\sigma a-\sigma c)+2ubuc\cos(\sigma b-\sigma c) \quad (3)$$

The difference between the two interference intensities obtained by time division is as shown by the following expression (4):

$$I_2(\rho)-I_1(\rho)=2uaub\cos(\sigma a-\sigma b)+2uauc\cos(\sigma a-\sigma c) \quad (4)$$

When here, the thickness of the pure water layer 10, i.e., the distance from the reference surface to the polished surface, is $d(\rho)'$ and the refractive index of the pure water layer 10 is $n_0$ and the angle of reflection on the boundary surface of the pure water layer 10/the insulating layer 5 is $\phi_0$ and the refractive index of the material of the prism 11 is N and the center wavelength of the oscillation spectrum of the light source 14 is $\lambda$ and $k=2\pi/\lambda$, $$\sigma a-\sigma b=k[2n_0 d(\rho)'\cos\phi_0].$$

and $$\sigma a-\sigma c=k[2n_0 d(\rho)'\cos\phi_0+2n_1 d(\rho)\cos\phi_1].$$

Here, $n_0$, $n_1$, $\phi_0$, $\phi_1$ and $d(\rho)$ are known from expression (3) and therefore, expression (4) showing the difference between the two interference intensities varies with $d(\rho)'$, i.e., the aforementioned distance from the reference surface to the polished surface, as a variable. By calculating this $d(\rho)'$ by a calculating process, the surface configuration of the polished surface is calculated.

In the present embodiment, the film thickness distribution and the surface configuration measurement value of the polished surface found by such a method and apparatus are stored in a memory portion during each measurement and the differential from the film thickness distribution which is the final target is compared. When this differential is not within a predetermined range of value, control is effected so that the polishing rate, the slurry density in the polishing liquid, the temperature of the polished surface, the polishing pressure distribution, etc., are appropriately corrected from the differential value and the surface configuration measurement value, and the polishing of portions of which the flattening is improper is efficiently expedited.

After the work of comparing this differential is repeated a plurality of times, the polishing work is terminated when this differential falls within a predetermined range of value.

Figure 19:
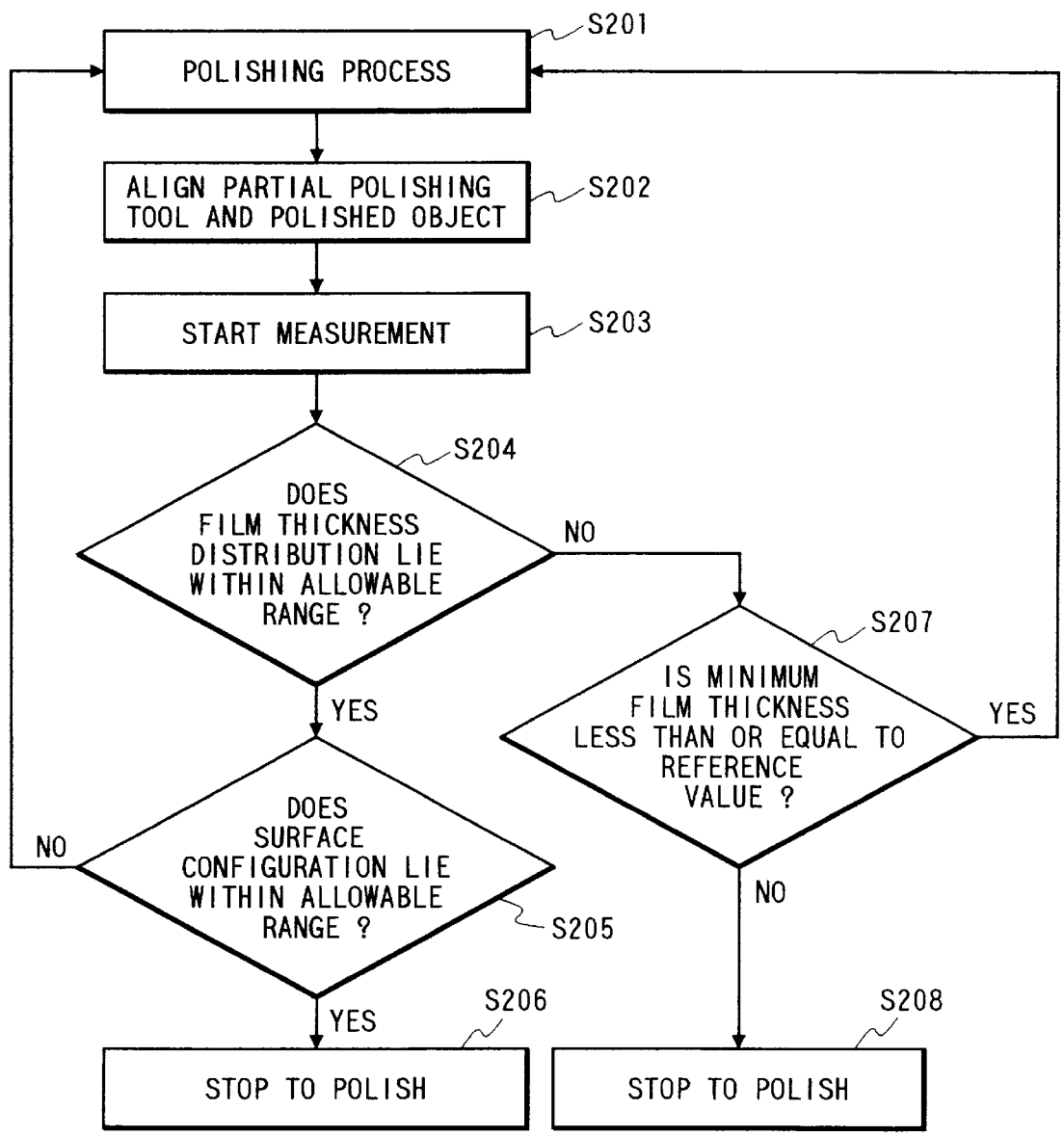
FIG. 19 is a flow chart of the operation of Embodiment 7 of the present invention.

The flow of the detection of the termination point of the flattening work by the chemical and mechanical polishing of the present embodiment is shown in FIG. 19 and will be described below.

[Step 201 (S201)]

The partial polishing tool 4 and the polished object 101 are driven relative to each other to thereby chemically-mechanically polish the polished object.

[Step 202 (S202)]

The partial polishing tool 4 and the polished object 101 are aligned with each other.

[Step 203 (S203)]

The position γ of the partial polishing tool 4 in which the sensor 2 is contained is driven and controlled while the rotated position θ of the polished object 101 is driven and controlled by the use of the rotary encoder 21, and the positional information of the polished object 101 and the partial polishing tool 4 is stored and the film thickness and surface configuration of the polished object 101 are measured by the sensor 2, and the film thickness distribution and surface configuration value of the polished surface are stored.

[Step 204 (S204)]

Whether both of the maximum film thickness dmax and minimum film thickness dmin of the measured film thickness distribution are within an allowable range (the upper limit film thickness STU and the lower limit film thickness STL) is determined, and if both are within the allowable range, advance is made to step 205, and if both are outside the allowable range, advance is made to step 207.

[Step 205 (S205)]

Whether the measured surface configuration is within an allowable range is determined. That is, the measured unevenness of the surface of the polished object is made into a numerical value representative of the surface roughness such as dispersion from the peak-and-valley value and the mean value, and whether the numerical value is within a predetermined allowable range is determined. If the numerical value is within the allowable range, advance is made to step 206, and if the numerical value is outside the allowable range, return is made to step 201.

[Step 206 (S206)]

The subsequent polishing of the polished object is stopped.

[Step 207 (S207)]

Whether the measured film thickness distribution is within the lower limit of an allowable range is determined. That is, whether the minimum film thickness dmin of the measured film thickness distribution is equal to or less than the lower limit film thickness STL (reference value) is determined. If the minimum film thickness dmin is equal to or less than the lower limit film thickness STL, advance is made to step 208, and if the minimum film thickness dmin is greater than the lower limit film thickness STL, return is made to step 201.

[Step 208 (S208)]

The subsequent polishing of the polished object is stopped.

In the present embodiment, the single mode semiconductor laser 17 as means for making the coherent distance of the light source different is made into a multimode by a high frequency superposing circuit and is time-divided to thereby effect the aforedescribed measurement of $I_1(\rho)$ and $I_2(\rho)$, but alternatively, two light sources differing in coherent distance from each other may be spatially separately disposed and two image pickup elements corresponding thereto may be provided so that the aforedescribed measurement of $I_1(\rho)$ and $I_2(\rho)$ may be effected.

Also, in the distance measuring means 9 for measuring the distance from the reference surface to the polished surface, the angle of incidence of the irradiating light beam may be 0° (parallel to the Z-axis) and the film thickness measuring means 8 for measuring the film thickness of the insulating layer 5 and the optical path may be partly common to each other.

While in the above-described embodiments, a description has been made of the insulating film, the present invention is also applicable, as the application of chemical and mechanical polishing in the semiconductor process, to a polishing method and a polishing apparatus by the measurement of the film thickness distribution and surface configuration of the thin layer of a metallic film even in the polishing as after the formation of a tungsten film or wiring film by contact or a through hole, and further, the film thickness distribution and surface configuration of an insulating film from which the metallic film has been removed.

The invention may be embodied in other specific forms without departing from the spirit or essential characteristics thereof. The illustrated embodiments are, therefore, to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A polishing method of driving the surface of a layer provided on the surface of a substrate and polishing means relative to each other to polish the surface of said layer, said method comprising the steps of:

setting a reference surface at a position sufficiently longer from the surface of said layer than the film thickness of said layer;

illuminating first and second light beams differing in coherent distance from each other from light source means to said layer and said reference surface;

individually detecting the reflected light beam from each surface based on said first light beam and the reflected light beam from each surface based on said second light beam by detecting means; and obtaining the surface information of said layer from a signal from said detecting means, and controlling the continuation or stoppage of the polishing of said layer on the basis of said surface information.

2. The method of claim 1 wherein the surface information of said layer is the surface configuration and film thickness distribution of said layer.

3. The method of claim 2 wherein said step of controlling has the determining step of determining whether the surface configuration and film thickness distribution of said layer are within a preset allowable range.

4. The method of claim 1 wherein said step of controlling has the step of obtaining the surface information of said layer from the difference between the intensity of the reflected light beam from each surface based on said first light beam and the intensity of the reflected light beam from each surface based on said second light beam.

5. A polishing apparatus for driving the surface of a layer provided on the surface of a substrate and polishing means relative to each other to thereby polish said layer, said apparatus comprising:

a reference surface located at a position sufficiently longer from the surface of said layer than the film thickness of said layer;

illuminating means for illuminating first and second light beams differing in coherent-distance from each other to said layer and said reference surface;

detecting means for individually detecting the reflected light beam from each surface based on said first light beam and the reflected light beam from each surface based on said second light beam; and control means for obtaining the surface information of said layer from a signal from said detecting means and controlling the continuation or stoppage of the polishing of said layer on the basis of said surface information.

6. The apparatus of claim 5 wherein the surface information of said layer is the surface configuration and film thickness distribution of said layer.

7. The apparatus of claim 6 wherein said control means has a determining portion for determining whether the surface information and film thickness distribution of said layer are within a preset allowable range.

8. The apparatus of claim 5 wherein said illuminating means comprises a semiconductor laser that varies a coherent distance of a laser beam emitted therefrom.

9. The apparatus of claim 5 wherein said control means finds the surface information of said layer from the difference between the intensity of the reflected light beam from each surface based on said first light beam and the intensity of the reflected light beam from each surface based on said second light beam.

10. A polishing method of driving the surface of a layer provided on the surface of a substrate and polishing means having a polishing pad of an area smaller than that of the surface of said layer relative to each other to thereby polish said layer, said method comprising:

the detecting step of detecting the surface information of said layer by detecting means provided on a portion of said polishing means; and the controlling step of controlling the continuation or stoppage of the polishing of said layer on the basis of a signal from said detecting means.

11. The method of claim 10 wherein said polishing means is movable in a plane parallel to the surface of said layer, and said detecting step has the step of detecting the surface information of said layer by the utilization of position information from position detecting means for detecting the position information of said polishing means in said plane.

12. The method of claim 10 wherein said detecting step has the step of detecting the distance from the surface of said layer to a reference surface and measuring the film thickness of said layer.

13. The method of claim 10 wherein said detecting step has the step of detecting the surface configuration and film thickness distribution of said layer, and said controlling step has the step of determining whether the surface configuration and film thickness distribution of said layer obtained from said detecting step are within a preset allowable range.

14. A polishing apparatus for polishing the surface of a layer provided on the surface of a substrate said apparatus comprising:

polishing means driven relative to the surface of said layer and having a polishing pad of an area smaller than that of the surface of said layer; and detecting means secured to said polishing means for detecting the surface information of said layer.

15. The apparatus of claim 14 wherein said polishing means is movable in a plane parallel to the surface of said layer, and has position detecting means for detecting the position information of said polishing means in said plane, and said detecting means utilizes the position information from said position detecting means to find the surface information of said layer.

16. The apparatus of claim 14 wherein said detecting means has distance measuring means for detecting the distance from the surface of said layer to a reference surface and measuring the film thickness of said layer.

17. The apparatus of claim 14 having control means for controlling the continuation or stoppage of the polishing of said layer on the basis of a signal from said detecting means.

18. The apparatus of claim 17 wherein said detecting means has means for detecting the surface configuration and film thickness distribution of said layer, and said control means has a determining portion for determining whether the surface configuration and film thickness distribution of said layer obtained from said detecting means are within a preset allowable range.

* * * * *

UNITED STATES PATENT AND TRADEMARK OFFICE
CERTIFICATE OF CORRECTION

PATENT NO. : 6,093,081  
DATED : July 25, 2000  
INVENTOR(S) : Masaru Nyui et al.

It is certified that error appears in the above-identified patent and that said Letters Patent is hereby corrected as shown below:

Column 7,
Line 44, "reset" should read -- preset --.

Column 8,
Line 16, "with" should be deleted.

Column 17,
Line 63, "f ilm" should read -- film --.

Column 18,
Line 38, "σa-σb=k[$2n_0d(\rho)'\cos\varnothing_0$]." should read -- σa-σb=k[$2n_0d(\rho)'\cos\varnothing_0$] --.

Column 20,
Line 66, "coherent-distance" should read -- coherent distance --.

Signed and Sealed this

First Day of July, 2003

JAMES E. ROGAN  
*Director of the United States Patent and Trademark Office*